United States Patent
Ma et al.

(10) Patent No.: US 12,027,648 B2
(45) Date of Patent: Jul. 2, 2024

(54) LIGHT-EMITTING DIODE CHIP, DISPLAY SUBSTRATE AND MANUFACTURING METHOD THEREOF

(71) Applicants: BOE MLED Technology Co., Ltd., Beijing (CN); BOE Technology Group Co., Ltd., Beijing (CN)

(72) Inventors: Junjie Ma, Beijing (CN); Haiwei Sun, Beijing (CN); Yuanda Lu, Beijing (CN); Shanwei Yang, Beijing (CN); Linxia Qi, Beijing (CN); Zhijun Xiong, Beijing (CN); Jiawei Zhao, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 179 days.

(21) Appl. No.: 17/417,493

(22) PCT Filed: Sep. 29, 2020

(86) PCT No.: PCT/CN2020/118932
§ 371 (c)(1),
(2) Date: Jun. 23, 2021

(87) PCT Pub. No.: WO2022/067530
PCT Pub. Date: Apr. 7, 2022

(65) Prior Publication Data
US 2022/0336706 A1    Oct. 20, 2022

(51) Int. Cl.
*H01L 33/38*     (2010.01)
*H01L 25/075*    (2006.01)
(Continued)

(52) U.S. Cl.
CPC ........ *H01L 33/382* (2013.01); *H01L 25/0753* (2013.01); *H01L 33/005* (2013.01);
(Continued)

(58) Field of Classification Search
CPC . H01L 33/382; H01L 25/0753; H01L 33/005; H01L 33/62; H01L 2933/0016;
(Continued)

(56) References Cited

U.S. PATENT DOCUMENTS

2012/0085986 A1* 4/2012 Iwanaga ............... H01L 33/38
                                                          257/9
2013/0230339 A1* 9/2013 Ogihara ................ B41J 2/45
                                                          399/220
(Continued)

FOREIGN PATENT DOCUMENTS

CN    102804415 A    11/2012
CN    107910346 A    4/2018
(Continued)

OTHER PUBLICATIONS

Aug. 7, 2023—(EP)—Extended European Search Report Appn 20955556.4.

*Primary Examiner* — S M Sohel Imtiaz
(74) *Attorney, Agent, or Firm* — Banner & Witcoff, Ltd.

(57) ABSTRACT

A light-emitting diode chip, a display substrate and a manufacturing method thereof are disclosed. The light-emitting diode chip includes a first conductive type semiconductor layer, a light-emitting layer, at least two second conductive type semiconductor layers, and at least two first electrodes; the at least two second conductive type semiconductor layers are at a side of the light-emitting layer away from the first conductive type semiconductor layer, the at least two first electrodes are electrically respectively connected with the at least two second conductive type semiconductor
(Continued)

layers. Orthographic projections of the at least two second conductive type semiconductor layers on the first conductive type semiconductor layer are spaced apart from each other, and orthographic projections of the at least two first electrodes on the first conductive type semiconductor layer are spaced apart from each other.

20 Claims, 15 Drawing Sheets

(51) Int. Cl.
    *H01L 33/00*     (2010.01)
    *H01L 33/62*     (2010.01)

(52) U.S. Cl.
    CPC ...... *H01L 33/62* (2013.01); *H01L 2933/0016* (2013.01); *H01L 2933/0066* (2013.01)

(58) Field of Classification Search
    CPC ............. H01L 2933/0066; H01L 33/20; H01L 27/156; H10K 59/00
    See application file for complete search history.

(56) References Cited

U.S. PATENT DOCUMENTS

| | | | |
|---|---|---|---|
| 2017/0213502 A1* | 7/2017 | Henry | G09G 3/2003 |
| 2018/0198020 A1* | 7/2018 | Lai | H01L 27/1259 |
| 2019/0067529 A1* | 2/2019 | Doan | H01L 33/50 |
| 2019/0296188 A1* | 9/2019 | Lai | H01L 33/20 |
| 2022/0216373 A1* | 7/2022 | Yoo | H01L 25/0753 |

FOREIGN PATENT DOCUMENTS

| | | |
|---|---|---|
| EP | 1596441 A2 | 11/2005 |
| JP | 2004079972 A | 3/2004 |
| KR | 20200026677 A | 3/2020 |

\* cited by examiner

100

100

100

100

100

100

100

100

100

100

LIGHT-EMITTING DIODE CHIP, DISPLAY SUBSTRATE AND MANUFACTURING METHOD THEREOF

This application is a U.S. National Phase Entry of International Application No. PCT/CN2020/118932 filed on Sep. 29, 2020, designating the United States of America. The present application claims priority to and the benefit of the above-identified application and the above-identified application is incorporated by reference herein in its entirety.

TECHNICAL FIELD

At least one embodiment of the present disclosure relates to a light-emitting diode chip, a display substrate and a manufacturing method thereof.

BACKGROUND

With the continuous development of display technology, light-emitting diode display technology as a new display technology has gradually become one of the research hotspots. The light-emitting diode display technology realizes display by utilizing an array composed of light-emitting diodes (LEDs). Compared with other display technologies, the light-emitting diode display technology has advantages of high luminous intensity, fast response speed, low power consumption, low voltage demand, light and thin equipment, long service life, strong shockproof resistance and strong anti-interference ability.

Light-emitting diode (LED) is a semiconductor device that emits light by recombination of electrons and holes, and is usually made of a compound of at least one selected from a group consisting of gallium (Ga), arsenic (As), phosphorus (P), nitrogen (N) and indium (In). Light-emitting diodes can efficiently convert electric energy into light energy, and can emit monochromatic light of different colors. For example, gallium arsenide diodes can emit red light, gallium phosphide diodes can emit green light, silicon carbide diodes can emit yellow light and gallium nitride diodes can emit blue light.

SUMMARY

Embodiment of the present disclosure provides a light-emitting diode chip, a display substrate and a manufacturing method thereof. The light-emitting diode chip includes a first conductive type semiconductor layer, a light-emitting layer, at least two second conductive type semiconductor layers and at least two first electrodes; the light-emitting layer is at a side of the first conductive type semiconductor layer; the at least two second conductive type semiconductor layers are at a side of the light-emitting layer away from the first conductive type semiconductor layer; and the at least two first electrodes are electrically respectively connected with the at least two second conductive type semiconductor layers. Orthographic projections of the at least two second conductive type semiconductor layers on the first conductive type semiconductor layer are spaced apart from each other, and orthographic projections of the at least two first electrodes on the first conductive type semiconductor layer are spaced apart from each other. In the light-emitting diode chip, one first electrode, the first conductive type semiconductor layer, the light-emitting layer and one second conductive type semiconductor layer constitute a light-emitting structure. Because the light-emitting diode chip includes at least two second conductive type semiconductor layers and at least two first electrodes, the light-emitting diode chip can possess at least two light-emitting structures capable of emitting light independently. On the one hand, under the condition that the overall size of the light-emitting diode chip remains unchanged, by forming a plurality of light-emitting structures in the light-emitting diode chip, the size of a single light-emitting structure can be reduced and higher pixels per inch can be realized. On the other hand, due to the small size of the single light-emitting structure, the efficiency of the single light-emitting structure is also high under drive of a small current.

At least one embodiment of the present disclosure provides a light-emitting diode chip, including: a first conductive type semiconductor layer; a light-emitting layer at a side of the first conductive type semiconductor layer; at least two second conductive type semiconductor layers at a side of the light-emitting layer away from the first conductive type semiconductor layer; and at least two first electrodes electrically respectively connected with the at least two second conductive type semiconductor layers, orthographic projections of the at least two second conductive type semiconductor layers on the first conductive type semiconductor layer are spaced apart from each other, and orthographic projections of the at least two first electrodes on the first conductive type semiconductor layer are spaced apart from each other.

For example, the light-emitting diode chip provided by an embodiment of the present disclosure further including: a second electrode electrically connected to the first conductive type semiconductor layer, the second electrode, the first conductive type semiconductor layer, the light-emitting layer, the at least two second conductive type semiconductor layers and the at least two first electrodes constitute at least two light-emitting structures, and the at least two light-emitting structures share the first conductive type semiconductor layer.

For example, in the light-emitting diode chip provided by an embodiment of the present disclosure, the second electrode is at a side of the first conductive type semiconductor layer away from the light-emitting layer, and the at least two first electrodes are at a side of the at least two second conductive type semiconductor layers away from the light-emitting layer.

For example, in the light-emitting diode chip provided by an embodiment of the present disclosure, both the second electrode and the at least two first electrodes are at a side of the at least two second conductive type semiconductor layers away from the light-emitting layer.

For example, in the light-emitting diode chip provided by an embodiment of the present disclosure, the orthographic projections of the at least two first electrodes on the first conductive type semiconductor layer surrounds an orthographic projection of the second electrode on the first conductive type semiconductor layer.

For example, in the light-emitting diode chip provided by an embodiment of the present disclosure, a planar shape of the first conductive type semiconductor layer is an N-polygon, and the orthographic projections of the at least two first electrodes on the first conductive type semiconductor layer are respectively on perpendicular bisectors of at least two edges of the N-polygon or on corners of the N-polygon, and the at least two edges are uniformly distributed among all edges of the N-polygon, an orthographic projection of the second electrode on the first conductive type semiconductor layer is at a center of the N-polygon, and N is a positive integer greater than or equal to 3.

For example, in the light-emitting diode chip provided by an embodiment of the present disclosure, a planar shape of the first conductive type semiconductor layer is any one selected from a group consisting of triangle, rectangle, cross shape, pentagon, hexagon and octagon.

For example, in the light-emitting diode chip provided by an embodiment of the present disclosure, the planar shape of the first conductive type semiconductor layer is a triangle, and the at least two first electrodes include three first electrodes, orthographic projections of the three first electrodes on the first conductive type semiconductor layer are respectively at three corners of the triangle, and an orthographic projection of the second electrode on the first conductive type semiconductor layer is at a center of the triangle.

For example, in the light-emitting diode chip provided by an embodiment of the present disclosure, the planar shape of the first conductive type semiconductor layer is a cross shape, the at least two first electrodes include four first electrodes, orthographic projections of the four first electrodes on the first conductive type semiconductor layer are respectively at four ends of the cross shape, and an orthographic projection of the second electrode on the first conductive type semiconductor layer is at a center of the cross shape.

For example, in the light-emitting diode chip provided by an embodiment of the present disclosure, a size of the first conductive type semiconductor layer ranges from 3 mil to 5 mil, and a size of the orthographic projection of each of the first electrodes on the first conductive type semiconductor layer is less than 20 microns.

At least one embodiment of the present disclosure further provides a display substrate, including: a substrate; a plurality of first light-emitting diode chips on the substrate, each of the plurality of first light-emitting diode chips is any one of the abovementioned light-emitting diode chip.

For example, in the display substrate provided by an embodiment of the present disclosure, further including: a pixel circuit layer between the substrate and the plurality of first light-emitting diode chips, the pixel circuit layer includes a plurality of pixel circuit units, each of the plurality of pixel circuit units includes a signal output end, in each of the plurality of first light-emitting diode chips, the at least two first electrodes are respectively connected with the signal output ends of different ones of the plurality of pixel circuit units.

For example, the display substrate provided by an embodiment of the present disclosure further including: a pixel circuit layer between the substrate and the plurality of light-emitting diode chips, the pixel circuit layer includes a plurality of pixel circuit units, each of the plurality of pixel circuit units includes a signal output end, in each of the plurality of first light-emitting diode chips, the at least two first electrodes are respectively connected with the signal output end of a same one of the plurality of pixel circuit units.

For example, in the display substrate provided by an embodiment of the present disclosure, the plurality of first light-emitting diode chips include a first color light-emitting diode chip, a second color light-emitting diode chip and a third color light-emitting diode chip, the first color light-emitting diode chip is configured to emit light of a first color, the second color light-emitting diode chip is configured to emit light of a second color, and the third color light-emitting diode chip is configured to emit light of a third color.

For example, the display substrate provided by an embodiment of the present disclosure further including: a plurality of second light-emitting diode chips on the substrate, each of the plurality of second light-emitting diode chips is configured to emit light of a first color, and the plurality of first light-emitting diode chips include a second color light-emitting diode chip and a third color light-emitting diode chip, the second color light-emitting diode chip is configured to emit light of a second color, and the third color light-emitting diode chip is configured to emit light of a third color, a yield of the second light-emitting diode chip is smaller than a yield of the second color light-emitting diode chip with a same size as the second light-emitting diode chip and smaller than a yield of the third color light-emitting diode chip with the same size as the second light-emitting diode chip.

For example, in the display substrate provided by an embodiment of the present disclosure, a planar shape of the first conductive type semiconductor layer is an N-polygon, the orthographic projections of the at least two first electrodes on the first conductive type semiconductor layer are on perpendicular bisectors of at least two edges of the N-polygon or on corners of the N-polygon, the at least two edges are uniformly distributed among all edges of the N-polygon, and an orthographic projection of the second electrode on the first conductive type semiconductor layer is at a center of the N-polygon, and N is a positive integer greater than or equal to 3, and the plurality of first light-emitting diode chips are arranged in an array along a first direction and a second direction on the substrate.

For example, in the display substrate provided by an embodiment of the present disclosure, centers of the first conductive type semiconductor layers of all first light-emitting diode chips arranged in the first direction are approximately on a same straight line.

For example, in the display substrate provided by an embodiment of the present disclosure, extension directions of two adjacent edges respectively of two first conductive type semiconductor layers of two adjacent ones of the plurality of first light-emitting diode chips arranged in the first direction are substantially parallel, and a distance between the two adjacent ones of the plurality of light-emitting diode chips arranged in the first direction is less than 75 microns.

For example, in the display substrate provided by an embodiment of the present disclosure, centers of the first conductive type semiconductor layers of the first light-emitting diode chips arranged in the first direction are on different straight lines, extension directions of two adjacent edges respectively of two first conductive type semiconductor layers of two adjacent ones of the plurality of first light-emitting diode chips arranged in the first direction are approximately parallel, and a distance between the two adjacent ones of the plurality of light-emitting diode chips arranged in the first direction is less than 75 microns.

For example, in the display substrate provided by an embodiment of the present disclosure, a planar shape of the first conductive type semiconductor layer is a rectangle, the at least two first electrodes include four first electrodes, orthographic projections of the four first electrodes on the first conductive type semiconductor layer are respectively at four corners of the rectangle, and an orthographic projection of the second electrode on the first conductive type semiconductor layer is at a center of the rectangle, the plurality of first light-emitting diode chips are arranged in an array along a first direction and a second direction on the substrate.

For example, in the display substrate provided by an embodiment of the present disclosure, the plurality of first light-emitting diode chips include a first color light-emitting diode chip, a second color light-emitting diode chip and a third color light-emitting diode chip, the second color light-emitting diode chip and the third color light-emitting diode chip are alternately arranged in the first direction to constitute a first light-emitting row, the first color light-emitting diode chips are arranged in the first direction to constitute a second light-emitting row, the first light-emitting row and the second light-emitting row are arranged in a staggered way, the first light-emitting row and the second light-emitting row are alternately arranged in the second direction, a size of the first color light-emitting diode chip in the first direction is larger than that of the second color light-emitting diode chip in the first direction, and in each first color light-emitting diode chip, each of the at least two first electrodes overlaps in the second direction with one of the at least two first electrodes of the second color light-emitting diode chip adjacent to this first color light-emitting diode chip and with one of the at least two first electrodes of the third color light-emitting diode chip adjacent to this first color light-emitting diode chip in the second direction.

For example, in the display substrate provided by an embodiment of the present disclosure, a planar shape of the first conductive type semiconductor layer is a cross shape, the at least two first electrodes include four first electrodes, orthographic projections of the four first electrodes on the first conductive type semiconductor layer are respectively at four ends of the cross shape, and an orthographic projection of the second electrode on the first conductive type semiconductor layer is at a center of the cross shape, the plurality of first light-emitting diode chips are arranged in an array along a first direction and a second direction on the substrate, and centers of the first conductive type semiconductor layers of the light-emitting diode chips arranged in the first direction are on different straight lines.

For example, the display substrate provided by an embodiment of the present disclosure further including: a black matrix between adjacent ones of the plurality of the first light-emitting diode chips, the substrate is a glass substrate.

For example, in the display substrate provided by an embodiment of the present disclosure, the plurality of first light-emitting diode chips are configured to emit light of a same color.

At least one embodiment of the present disclosure further provides a manufacturing method of any one of the above-mentioned display substrate, including: manufacturing structure layers of the plurality of light-emitting diode chips on a base substrate; splitting the base substrate on which the structure layers of the plurality of light-emitting diode chips are formed, to form a plurality of first light-emitting diode chips that are separated from each other; transferring the plurality of first light-emitting diode chips onto the substrate by adopting a transfer process; and bonding the plurality of first light-emitting diode chips on the substrate by adopting a bonding process.

For example, in the manufacturing method provided by an embodiment of the present disclosure, splitting structure layers of the plurality of light-emitting diode chips to form the plurality of first light-emitting diode chips that are separated from each other includes: adopting an etching process to split the structure layers of the plurality of light-emitting diode chips to form the plurality of first light-emitting diode chips that are separated from each other, bonding the plurality of first light-emitting diode chips on the substrate by adopting the bonding process includes: bonding the plurality of first light-emitting diode chips on the substrate by adopting a reflow soldering process.

At least one embodiment of the present disclosure further provides a manufacturing method of any one of the above-mentioned display substrates, including: forming the first conductive type semiconductor layer, the light-emitting layer, the at least two second conductive type semiconductor layers and the at least two first electrodes of each of the plurality of first light-emitting diode chips on a base substrate; transferring the base substrate and the plurality of first light-emitting diode chips on the base substrate onto the substrate by adopting a transfer process; peeling off the base substrate; forming an electrode material layer on a side of the first conductive type semiconductor layers of the plurality of first light-emitting diode chips away from the substrate; patterning the electrode material layer to form a plurality of second electrodes corresponding to the plurality of light-emitting diode chips; and etching and separating the plurality of light-emitting diode chips by adopting an etching process.

At least one embodiment of the present disclosure further provides manufacturing method of any one of the above-mentioned display substrate, including: forming the plurality of first light-emitting diode chips on a base substrate; transferring the base substrate and the plurality of first light-emitting diode chips on the base substrate onto the substrate by adopting a transfer process; peeling off the base; and etching and separating the plurality of first light-emitting diode chips by adopting an etching process.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1:
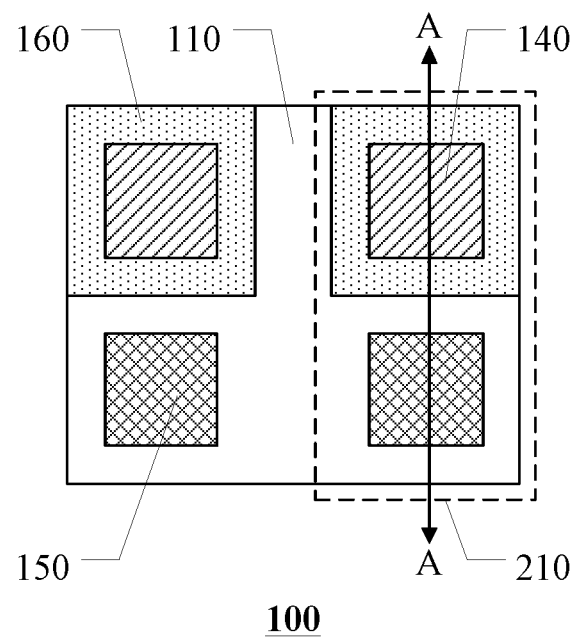
FIG. 1 is a schematic planar view of a light-emitting diode chip provided by an embodiment of the present disclosure.

In order to make objects, technical details and advantages of the embodiments of the invention apparent, technical solutions according to the embodiments of the present disclosure will be described clearly and completely as below in conjunction with the accompanying drawings of embodiments of the present disclosure. It is to be understood that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly.

Generally, a manufacturing method of a light-emitting diode display module includes: manufacturing a plurality of light-emitting diode chips; transferring the plurality of light-emitting diode chips onto a drive substrate through a transfer process; bonding the plurality of light-emitting diode chips transferred to the drive substrate with the drive substrate; encapsulating the drive substrate and the plurality of light-emitting diode chips on the drive substrate. However, the above manufacturing method of the light-emitting diode display module has many defects as follows: 1. because 7-9 mask processes are needed to manufacture the light-emitting diode chips, the yield of the light-emitting diode chips is relatively low, and the smaller the size of the light-emitting diode chips are, the higher the cost is; 2. it is difficult to manufacture a light-emitting diode chip with a size less than 3*5 mil, which limits the number of pixels per inch of the light-emitting diode display module, and in addition, it is also difficult to reduce the space between the light-emitting diode chips, and it is impossible to realize high pixels per inch (PPI); 3. high pixels per inch (PPI) not only means that the size of the light-emitting diode chips needs to be reduced, but also the number of the light-emitting diode chips needs to be increased, in the case where the size of the light-emitting diode chips is small, it will increase the difficulty of transferring the light-emitting diode chips to the drive substrate, and the increase in the number of the light-emitting diode chips also increases the transfer difficulty, resulting in a decline in yield and an increase in cost; 4. the luminance of the light-emitting diode chips is not linearly related to the drive current, so it is difficult to control the luminance, and the efficiency of ordinary light-emitting diode chips is low under a small current (for example, less than 100 μA) driven by active matrix (AM); 5. it is difficult to manufacture the light-emitting diode chips driven by a high voltage.

In this regard, at least one embodiment of the present disclosure provides a light-emitting diode chip, a display substrate and a manufacturing method thereof. The light-emitting diode chip includes a first conductive type semiconductor layer, a light-emitting layer, at least two second conductive type semiconductor layers and at least two first electrodes; the light-emitting layer is at a side of the first conductive type semiconductor layer; the at least two second conductive type semiconductor layers are at a side of the light-emitting layer away from the first conductive type semiconductor layer; and the at least two first electrodes are electrically respectively connected with the at least two second conductive type semiconductor layers. Orthographic projections of the at least two second conductive type semiconductor layers on the first conductive type semiconductor layer are spaced apart from each other, and orthographic projections of the at least two first electrodes on the first conductive type semiconductor layer are spaced apart from each other. In the light-emitting diode chip, one first electrode, the first conductive type semiconductor layer, the light-emitting layer and one second conductive type semiconductor layer constitute a light-emitting structure. Because the light-emitting diode chip includes at least two second conductive type semiconductor layers and at least two first electrodes, the light-emitting diode chip can possess at least two light-emitting structures capable of emitting light independently. On the one hand, under the condition that the overall size of the light-emitting diode chip remains unchanged, by forming a plurality of light-emitting structures in the light-emitting diode chip, the size of a single light-emitting structure can be reduced and higher pixels per inch can be realized. On the other hand, due to the small size of the single light-emitting structure, the efficiency of the single light-emitting structure is also high under drive of a small current.

Hereinafter, the light-emitting diode chip, the display substrate and the manufacturing method thereof provided by embodiments of the present disclosure are described in detail with reference to the accompanying drawings.

Figure 2A:
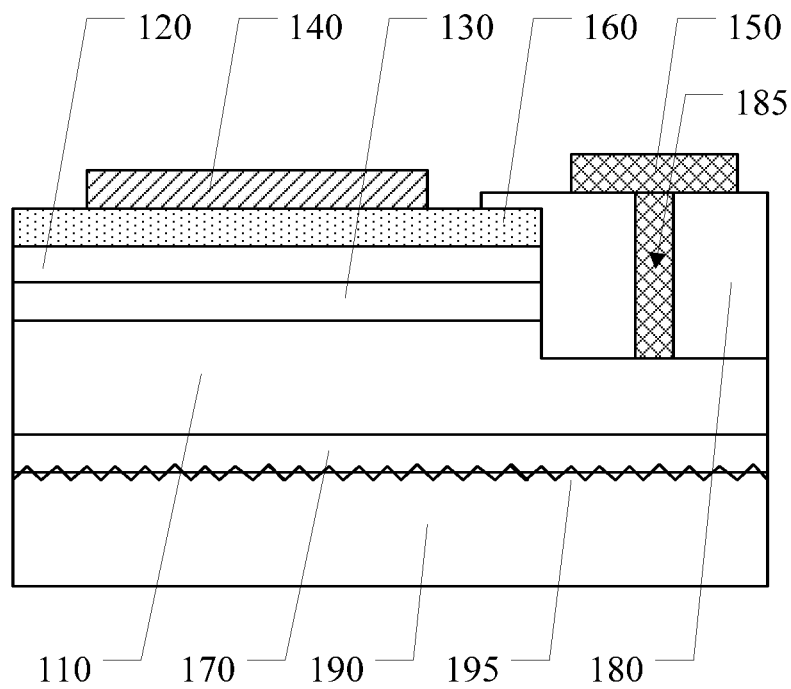
FIG. 2A is a schematic cross-sectional view of the light-emitting diode chip provided by an embodiment of the present disclosure taken along the line AA in FIG. 1.
Figure 2B:
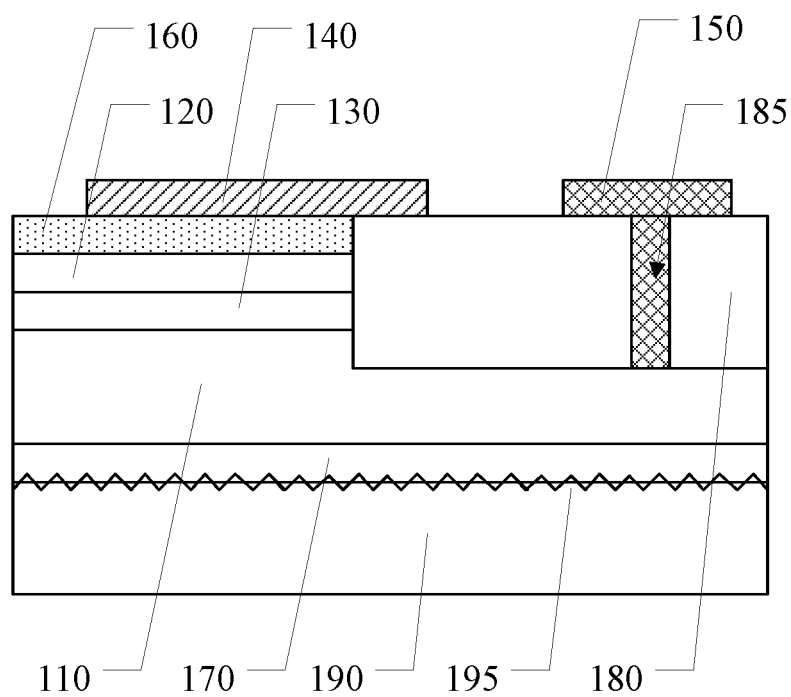
FIG. 2B is another schematic cross-sectional view of the light-emitting diode chip provided by an embodiment of the present disclosure taken along the line AA in FIG. 1.
Figure 2C:
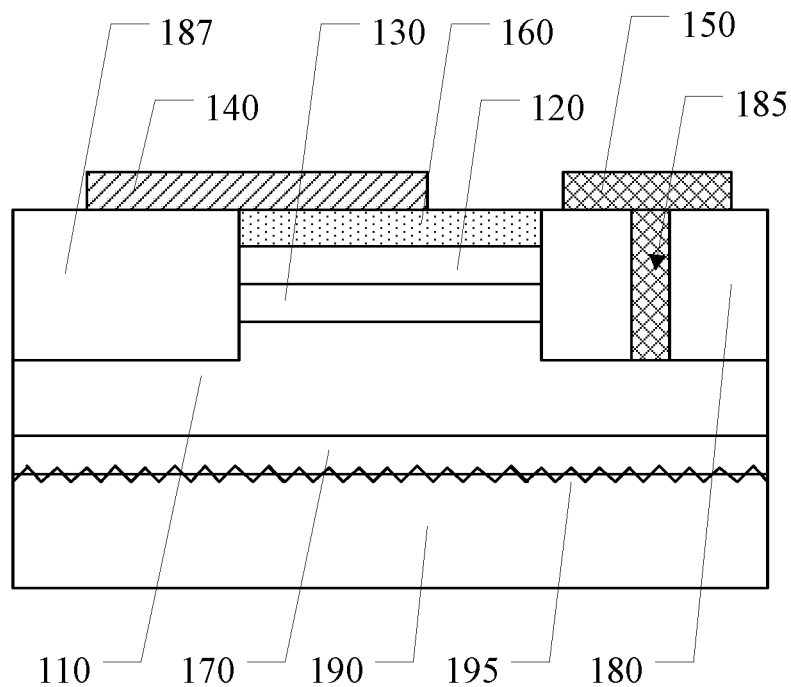
FIG. 2C is further another schematic cross-sectional view of the light-emitting diode chip provided by an embodiment of the present disclosure taken along the line AA in FIG. 1.

FIG. 1 is a schematic planar view of a light-emitting diode chip provided by an embodiment of the present disclosure; FIG. 2A is a schematic cross-sectional view of the light-emitting diode chip provided by an embodiment of the present disclosure taken along the line AA in FIG. 1; FIG. 2B is another schematic cross-sectional view of the light-emitting diode chip provided by an embodiment of the present disclosure taken along the line AA in FIG. 1; FIG. 2C is further another schematic cross-sectional view of the light-emitting diode chip provided by an embodiment of the present disclosure taken along the line AA in FIG. 1.

As illustrated by FIGS. 1, 2A, 2B and 2C, the light-emitting diode chip 100 includes a first conductive type semiconductor layer 110, a light-emitting layer 130, at least two second conductive type semiconductor layers 120 and at least two first electrodes 140. The light-emitting layer 130 is located at a side of the first conductive type semiconductor layer 110; the at least two second conductive type semiconductor layers 120 are located at a side of the light-emitting layer 130 away from the first conductive type semiconductor layer 110; the at least two first electrodes 140 are respectively electrically connected to the at least two second conductive type semiconductor layers 120. Orthographic projections of the at least two second conductive type semiconductor layers 120 on the first conductive type semiconductor layer 110 are spaced apart from each other, and orthographic projections of the at least two first electrodes 140 on the first conductive type semiconductor layer 110 are spaced apart from each other. It should be noted that the above-mentioned "conductive type" includes n type or p type. For example, the first conductive type semiconductor layer may be an n-type semiconductor layer, and the second conductive type semiconductor layer may be a p-type semiconductor layer; of course, embodiments of the present disclosure include but are not limited thereto, the first conductive type semiconductor layer may be an p-type semiconductor layer, and the second conductive type semiconductor layer may be a n-type semiconductor layer.

In the light-emitting diode chip provided by at least one embodiment of the disclosure, one first electrode, the first conductive type semiconductor layer, one second conductive type semiconductor layer and the light-emitting layer can constitute an LED light-emitting structure. Because the light-emitting diode chip comprises at least two second conductive type semiconductor layers and at least two first electrodes, the light-emitting diode chip can form at least two light-emitting structures capable of emitting light independently. On the one hand, under a condition that the overall size of the light-emitting diode chip remains unchanged, the size of a single light-emitting structure can be reduced by forming a plurality of light-emitting structures in the light-emitting diode chip, that is, the light-emitting diode chips with a smaller size can be manufactured with the existing process precision. Therefore, the light-emitting diode chip can reduce the manufacturing difficulty and cost of the small-sized LED light-emitting structure, and can realize higher pixels per inch.

Figure 3:
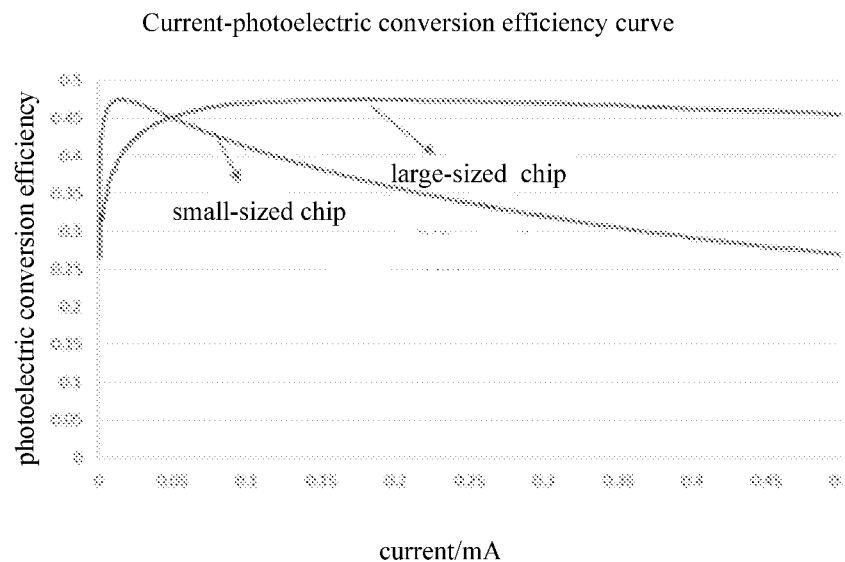
FIG. 3 is a comparison of luminous efficiency between a small-sized light-emitting diode chip and a large-sized light-emitting diode chip that are driven by different currents.

On the other hand, due to the small size of a single light-emitting structure, the efficiency of the single light-emitting structure is also high under drive of a small current. FIG. 3 is a comparison of luminous efficiency between a small-sized light-emitting diode chip and a large-sized light-emitting diode chip that are driven by different currents. As illustrated by FIG. 3, driven by a small current (for example, less than 50 µA), the light-emitting efficiency of the small-sized light-emitting diode chip is higher.

In some examples, the first conductive type semiconductor layer 110 is an n-type gallium nitride layer, and the second conductive type semiconductor layer 120 is a p-type gallium nitride layer. Of course, embodiments of the present disclosure include but are not limited thereto. For example, the first conductive type semiconductor layer 110 is a p-type gallium nitride layer, and the second conductive type semiconductor layer 120 is an n-type gallium nitride layer.

For example, in the case where the light-emitting diode chip is configured to emit blue light or green light, the first conductive type semiconductor layer and the second conductive type semiconductor layer may adopt gallium nitride (GaN) as described above. In the case where the light-emitting diode chip is used to emit red light, the first conductive type semiconductor layer and the second conductive type semiconductor layer may adopt at least one selected from a group consisting of gallium phosphide (GaP), aluminum gallium arsenide (AlGaAs) and aluminum gallium indium phosphide (AlGaInP). Of course, embodiments of the present disclosure include but are not limited thereto, and the first conductive type semiconductor layer and the second conductive type semiconductor layer may be made of other suitable materials.

In some examples, the size of the first conductive type semiconductor layer 110 ranges from 3 mil to 5 mil. And the size of the orthographic projection of each first electrode 140 on the first conductive type semiconductor layer 110 is less than 20 microns. Therefore, in the light-emitting diode chip, light-emitting structures with a size less than 20 microns can be manufactured by using a process of 3 mil to 5 mil. It should be noted that the size of the first conductive type semiconductor layer may be the length of the longest connection line between two points on edges of the first conductive type semiconductor layer. Similarly, the size of the orthographic projection of the first electrode on the first conductive type semiconductor layer may also be the length of the longest connection line between two points on edges of the orthographic projection of the first electrode on the first conductive type semiconductor layer.

In some examples, as illustrated by FIG. 1, FIG. 2A, FIG. 2B and FIG. 2C, the above-mentioned at least two first electrodes 140 are in one-to-one correspondence with the above-mentioned at least two second conductive type semiconductor layers 120, that is, in one light-emitting diode chip 100, the number of the first electrodes 140 is the same as the number of the second conductive type semiconductor layers 120, and one first electrode 140 is electrically connected with one corresponding second conductive type semiconductor layer 120.

In some examples, as illustrated by FIG. 1, FIG. 2A, FIG. 2B and FIG. 2C, the light-emitting diode chip 100 further includes a second electrode 150 electrically connected with the first conductive type semiconductor layer 110; the second electrode 150, the first conductive type semiconductor layer 110, the light-emitting layer 130, the at least two second conductive type semiconductor layers 120 and the at least two first electrodes 140 constitute at least two light-emitting structures 210, the at least two light-emitting structures 210 share the first conductive type semiconductor layer 110. That is, the above-mentioned light-emitting diode chip is a single manufactured light-emitting diode chip, not an integration of a plurality of light-emitting diode chips.

In some examples, as illustrated by FIG. 1, FIG. 2A, FIG. 2B and FIG. 2C, the second electrode 150 and the at least two first electrodes 140 are located at a side of the at least two second conductive type semiconductor layers 120 away from the light-emitting layer 130. Therefore, the light-emitting diode chip adopts a flip-chip structure, so that the current density can be increased and the luminous efficiency can be further increased.

For example, as illustrated by FIG. 2A, the first conductive type semiconductor layer 110, the light-emitting layer 130, and the second conductive type semiconductor layer 120 are sequentially stacked on a base substrate 190; the light-emitting layer 130 and the second conductive type semiconductor layer 120 are partially etched to expose the first conductive type semiconductor layer 110. Of course, a part of the thickness perpendicular to the base substrate 190 of the first conductive type semiconductor layer 110 may be etched away without etching through the first conductive type semiconductor layer 110. In this case, the light-emitting diode chip 100 further includes a first insulation layer 180 located on a side of the exposed portion of the first conductive type semiconductor layer 110 away from the base substrate 190; the first insulation layer 180 is in direct contact with the exposed portion of the first conductive type semiconductor layer 110. The light-emitting diode chip 100 further includes a contact hole 185, the contact hole 185 penetrates through the first insulation layer 180, and the second electrode 150 can be electrically connected to the first conductive semiconductor layer 110 through the contact hole 185. The first electrode 140 is located on a side of the second conductive semiconductor layer 120 away from the light-emitting layer 130, and an orthographic projection of the first electrode 140 on the base substrate 190 completely falls into an orthographic projection of the second conductive semiconductor layer 120 on the base substrate 190, which does not overlap with the orthographic projection of the first insulation layer 180 on the base substrate 190. Therefore, the current flows from the first electrode 140 to the second electrode 150 after flowing through the second conductive type semiconductor layer 120, the light-emitting layer 130 and the first conductive type semiconductor layer 110.

For example, as illustrated by FIG. 2A, the light-emitting diode chip 100 may further include a contact electrode 160 located between the first electrode 140 and the second conductive type semiconductor layer 120, thereby reducing a contact resistance between the first electrode 140 and the second conductive type semiconductor layer 120.

For example, as illustrated by FIG. 2B, by increasing the area of an orthographic projection of the first insulation layer 180 on the base substrate 190, that is, etching away more part of the light-emitting layers 130 and the second conductive semiconductor layers 120, the area of an orthographic projection of the light-emitting layer 130 and the area of an orthographic projection of the second conductive semiconductor layer 120 on the base substrate 190 can be reduced, thereby increasing the current density and further improving the light-emitting efficiency of the light-emitting diode chip. In this case, the orthographic projection of the first electrode 140 on the base substrate 190 partially overlaps with the orthographic projection of the first insulation layer 180 on the base substrate 190.

For example, as illustrated by FIG. 2B, the light-emitting diode chip 100 may further include a contact electrode 160 located between the first electrode 140 and the second conductive type semiconductor layer 120, thereby reducing the contact resistance between the first electrode 140 and the second conductive type semiconductor layer 120.

For example, as illustrated by FIG. 2C, a part of the light-emitting layer 130 and a part of the second conductive semiconductor layer 120 that are corresponding to the first electrode 140 may also be partially etched and removed. In this case, the light-emitting diode chip 100 may further include a second insulation layer 187, the second insulation layer 187 is located on a side of the exposed portion of the first conductive type semiconductor layer 110 away from the base substrate 190, and an orthographic projection of the second insulation layer 187 on the base substrate 190 at least partially overlaps with the orthographic projection of the first electrode 140 on the base substrate 190. The first electrode 140 is still located at the side of the second conductive semiconductor layer 120 away from the light-emitting layer 130, and the orthographic projection of the first electrode 140 on the base substrate 190 partially overlaps with the orthographic projection of the second conductive semiconductor layer 120 on the base substrate 190. Therefore, the light-emitting diode chip can further reduce the area of the light-emitting layer and the area of the second conductive semiconductor layer, thereby increasing the current density and further improving the light-emitting efficiency of the light-emitting diode chip.

For example, as illustrated by FIG. 2C, the light-emitting diode chip 100 may further include a contact electrode 160 located between the first electrode 140 and the second conductive type semiconductor layer 120, thereby reducing the contact resistance between the first electrode 140 and the second conductive type semiconductor layer 120.

For example, as illustrated by FIG. 2A, FIG. 2B and FIG. 2C, the base substrate 190 may be a sapphire substrate, and in this case, the sapphire base substrate 190 may further include a patterned sapphire substrate (PSS) 195. On the one hand, the patterned sapphire substrate 195 can effectively reduce the dislocation density of the first conductive type semiconductor layer (i.e., epitaxial layer), thereby reducing non-radiative recombination, reducing reverse leakage current and prolonging the life of the light-emitting diode chip. On the other hand, light emitted from the light-emitting layer 130 can be scattered many times in the patterned sapphire substrate 195, which changes the exit angle of the totally reflected light, thereby improving the extraction efficiency of the light. Of course, embodiments of the present disclosure include but are not limited thereto, and the light-emitting diode chip may not be provided with the above-mentioned patterned sapphire substrate. It should be noted that the base substrate may adopt other types of base substrates, such as a silicon carbide base.

For example, the patterned sapphire substrate 195 may be manufactured by a dry etching process. Of course, the embodiments of the present disclosure include but are not limited thereto, and the above-mentioned patterned sapphire substrate 195 may be manufactured by other suitable methods.

For example, as illustrated by FIG. 2A, FIG. 2B and FIG. 2C, the light-emitting diode chip 100 may further include a buffer layer 170 located between the first conductive type semiconductor layer 110 and the base substrate 190. The buffer layer 170 can improve the quality of the first conductive type semiconductor layer 110.

Figure 4A:
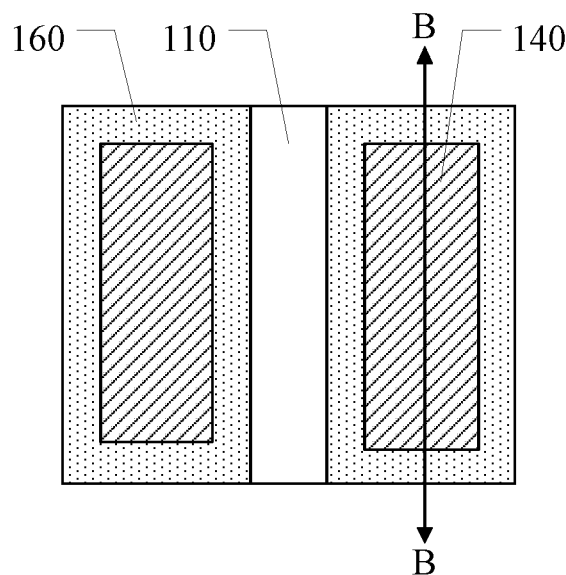
FIG. 4A is further another schematic planar view of the light-emitting diode chip provided by an embodiment of the present disclosure.
Figure 4B:
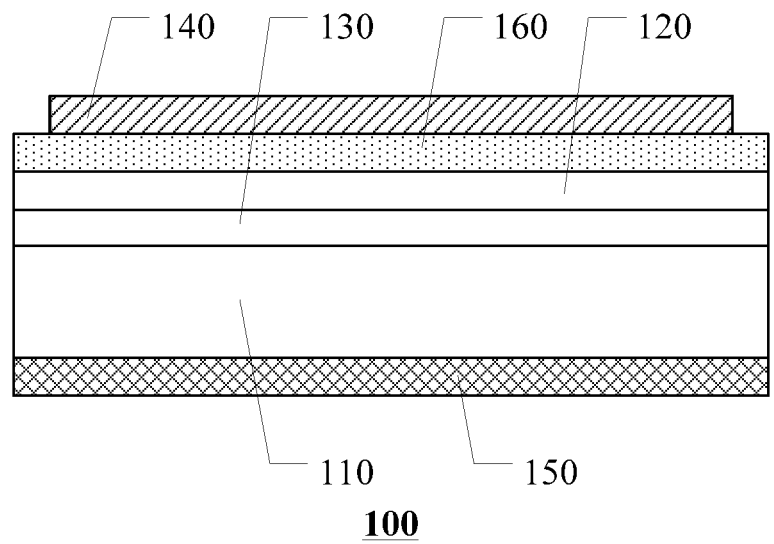
FIG. 4B is further another schematic cross-sectional view of the light-emitting diode chip taken along the BB line in FIG. 4A.

It is worth noting that the light-emitting diode chip provided by the embodiment of the present disclosure is not limited to the flip-chip structure, and the light-emitting diode chip may also adopt a vertical structure. FIG. 4A is another schematic planar view of the light-emitting diode chip provided by an embodiment of the present disclosure; FIG. 4B is another schematic cross-sectional view of the light-emitting diode chip taken along the BB line in FIG. 4A. As illustrated by FIG. 4A and FIG. 4B, the second electrode 150 is located on the side of the first conductive type semiconductor layer 110 away from the light-emitting layer 130, and the at least two first electrodes 140 are located on a side of the at least two second conductive type semiconductor layers 120 away from the light-emitting layer 130. Therefore, the light-emitting diode chip is a light-emitting diode chip with a vertical structure, so that the structure of the light-emitting diode chip is greatly simplified, and the manufacturing difficulty and the manufacturing cost are reduced. On the other hand, due to the simple structure of the light-emitting diode chip, the yield of the light-emitting diode chip can also be improved. Especially, for a light-emitting diode chip emitting red light, the yield can be increased from 40%-50% to over 80%, and the manufacturing cost can be reduced by over 50%.

On the other hand, in the case where the light-emitting diode chip adopts the vertical structure, the light-emitting layer (e.g., a PN junction or a quantum well layer) of the light-emitting diode chip is between the first electrode and the second electrode, so that the current can flow more smoothly in the light-emitting diode chip, thereby improving the light-emitting efficiency and reducing the energy loss.

In some examples, the light-emitting layer includes a multi-quantum well layer (MQW), and the multi-quantum well layer includes a plurality of quantum wells, so that the light-emitting intensity and light-emitting efficiency of the light-emitting diode chip can be improved. Of course, the embodiments of the present disclosure include but are not limited thereto, and the above-mentioned light-emitting layer may be other suitable light-emitting layers such as a quantum well layer or a PN junction.

In some examples, a planar shape of the first conductive type semiconductor layer is an N-polygon, and the orthographic projections of the at least two first electrodes on the first conductive type semiconductor layer are respectively located on perpendicular bisectors of at least two edges of the N-polygon or on corners of the N-polygon, the at least two edges are uniformly distributed among all edges of the polygon, and the orthographic projection of the second electrode on the first conductive type semiconductor layer is at a center of the N-polygon; N is a positive integer greater than or equal to 3. For example, in the case where N is equal to 3, the N-polygon is a triangle; in the case where N is equal to 4, the N-polygon is a rectangle; in the case where N is equal to 5, the N-polygon is a pentagon, and so on. Therefore, on the one hand, because the second electrode may be arranged at the center of the N-polygon, the light-emitting diode chip can realize that the plurality of light-emitting structures share one second electrode; on the other hand, the light-emitting diode chip can enable at least two light-emitting structures corresponding to at least two first electrodes to form pixels with the light-emitting structures of the adjacent light-emitting diode chips, so that each light-emitting structure can be used as a sub pixel to improve the pixels per inch of a display apparatus adopting the light-emitting diode chip.

Figure 5:
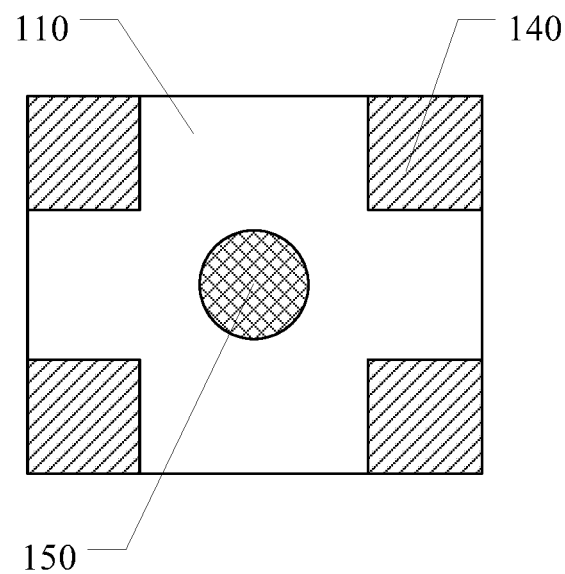
FIG. 5 is further another schematic view of the light-emitting diode chip provided by an embodiment of the present disclosure.

FIG. 5 is another schematic planar view of the light-emitting diode chip provided by an embodiment of the present disclosure. As illustrated by FIG. 5, the orthographic projections of at least two first electrodes 140 on the first conductive type semiconductor layer 110 surround the orthographic projection of the second electrode 150 on the first conductive type semiconductor layer 110. On the one hand, the light-emitting diode chip can realize that a plurality of light-emitting structures share one second electrode; on the other hand, the light-emitting diode chip can enable at least two light-emitting structures corresponding to at least two first electrodes to form pixels with the light-emitting structures in adjacent light-emitting diode chips, so that each light-emitting structure can be used as a sub pixel to improve the pixels per inch of a display apparatus adopting the light-emitting diode chip.

In some examples, as illustrated by FIG. 5, the planar shape of the first conductive type semiconductor layer 110 is a rectangle, the at least two first electrodes 140 include four first electrodes 140, the orthographic projections of the four first electrodes 140 on the first conductive type semiconductor layer 110 are respectively at four corners of the rectangle, and the orthographic projection of the second electrode 150 on the first conductive type semiconductor layer 110 is at the center of the rectangle. Therefore, in the case where two light-emitting diode chips are arranged adjacently, the light-emitting structure at a corner position of one of the two light-emitting diode chips is closer to the light-emitting structure at a corner position of the other of the two light-emitting diode chips, which facilitates the composition of a pixel including sub pixels of different colors. It should be noted that the above-mentioned sub pixels are usually light-emitting structures that emit monochromatic light, and one pixel can usually include sub pixels of three colors; for example, one pixel may include a red sub pixel, a green sub pixel, and a blue sub pixel.

In some examples, the planar shape of the first conductive type semiconductor layer may be any one selected from a group consisting of triangle, cross shape, pentagon, hexagon and octagon in addition to the rectangle described above. That is, the planar shape of the first conductive type semiconductor layer may be a triangle, a rectangle, a cross shape, a pentagon, a hexagon or an octagon.

Figure 6:
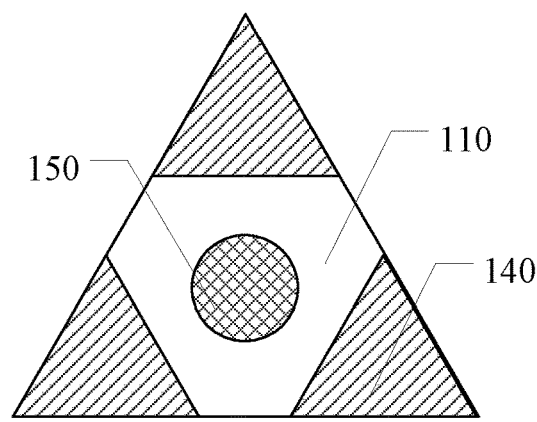
FIG. 6 is further another schematic planar view of the light-emitting diode chip provided by an embodiment of the present disclosure.

FIG. 6 is another schematic planar view of the light-emitting diode chip provided by an embodiment of the present disclosure; as illustrated by FIG. 6, the planar shape of the first conductive type semiconductor layer 110 is a triangle, the at least two first electrodes 140 include three first electrodes 140, orthographic projections of the three first electrodes 140 on the first conductive type semiconductor layer 110 are respectively at three corners of the triangle, and the orthographic projection of the second electrode 150 on the first conductive type semiconductor layer 110 is at the center of the triangle. Therefore, in the case where the two light-emitting diode chips are arranged adjacently, a distance between the light-emitting structures at the corners of the two light-emitting diode chips is closer, so that the two light-emitting diode chips can be better used as sub pixels to form pixels.

Figure 7:
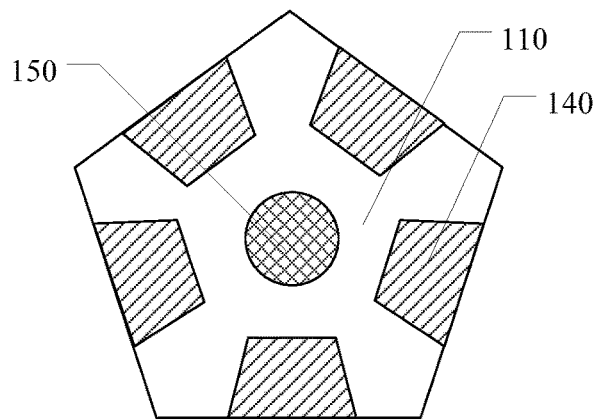
FIG. 7 is further another schematic planar view of the light-emitting diode chip provided by an embodiment of the present disclosure.

FIG. 7 is another schematic planar view of the light-emitting diode chip provided by an embodiment of the present disclosure; as illustrated by FIG. 7, the planar shape of the first conductive semiconductor layer 110 is a polygon, the orthographic projections of the at least two first electrodes 140 on the first conductive semiconductor layer 110 are on perpendicular bisectors of at least two edges of the polygon, the at least two edges of the polygon are uniformly distributed among all edges of the polygon, and the orthographic projection of the second electrode 150 on the first conductive semiconductor layer 110 is at the center of the polygon. Therefore, a plurality of light-emitting structures in the light-emitting diode chip are uniformly arranged.

For example, as illustrated by FIG. 7, the planar shape of the first conductive type semiconductor layer 110 is a pentagon, the at least two first electrodes 140 include five first electrodes 140, orthographic projections of the five first electrodes 140 on the first conductive type semiconductor layer 110 are respectively on perpendicular bisectors of five edges of the pentagon, and the orthographic projection of the second electrode 150 on the first conductive type semiconductor layer 110 is at the center of the pentagon.

Figure 8:
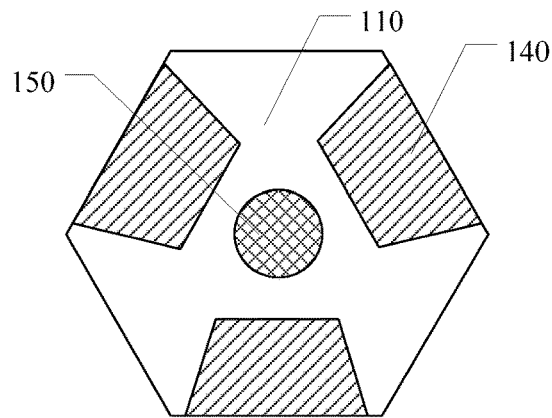
FIG. 8 is further another schematic planar view of the light-emitting diode chip provided by an embodiment of the present disclosure.

FIG. 8 is another schematic planar view of the light-emitting diode chip provided by an embodiment of the present disclosure; as illustrated by FIG. 8, the planar shape of the first conductive type semiconductor layer 110 is a hexagon, the at least two first electrodes 140 include three first electrodes 140, orthographic projections of the three first electrodes 140 on the first conductive type semiconductor layer 110 are respectively on perpendicular bisectors of three edges spaced apart from each other in the hexagon, and the orthographic projection of the second electrode 150 on the first conductive type semiconductor layer 110 is at the center of the hexagon.

Figure 9:
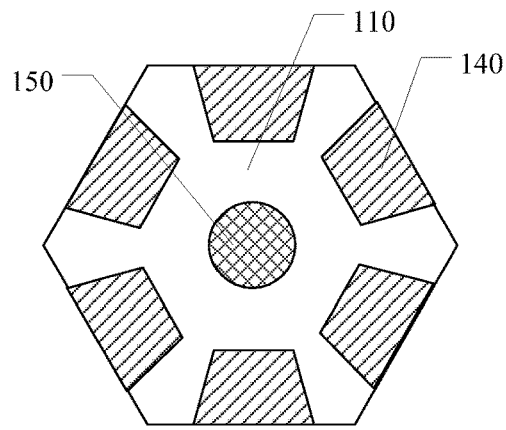
FIG. 9 is further another schematic planar view of the light-emitting diode chip provided by an embodiment of the present disclosure.

FIG. 9 is another schematic planar view of the light-emitting diode chip provided by an embodiment of the present disclosure; as illustrated by FIG. 9, the planar shape of the first conductive semiconductor layer 110 is a hexagon, the at least two first electrodes 140 include six first electrodes 140, orthographic projections of the six first electrodes 140 on the first conductive semiconductor layer 110 are respectively on perpendicular bisectors of six edges of the hexagon, and the orthographic projection of the second electrode 150 on the first conductive semiconductor layer 110 is at the center of the hexagon.

Figure 10:
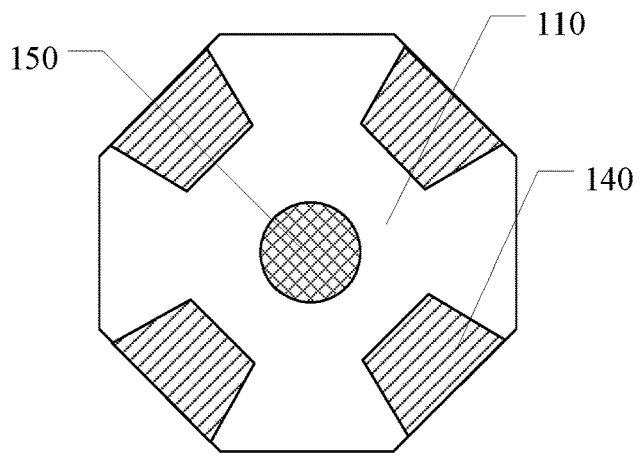
FIG. 10 is further another schematic planar view of the light-emitting diode chip provided by an embodiment of the present disclosure.

FIG. 10 is another schematic planar view of the light-emitting diode chip provided by an embodiment of the present disclosure; as illustrated by FIG. 10, the planar shape of the first conductive type semiconductor layer 110 is an octagon, and the at least two first electrodes 140 include four first electrodes 140, orthographic projections of the four first electrodes 140 on the first conductive type semiconductor layer 110 are respectively on perpendicular bisectors of four edges spaced apart from each other in the octagon, and the orthographic projection of the second electrode 150 on the first conductive type semiconductor layer 110 is at the center of the hexagon.

Figure 11:
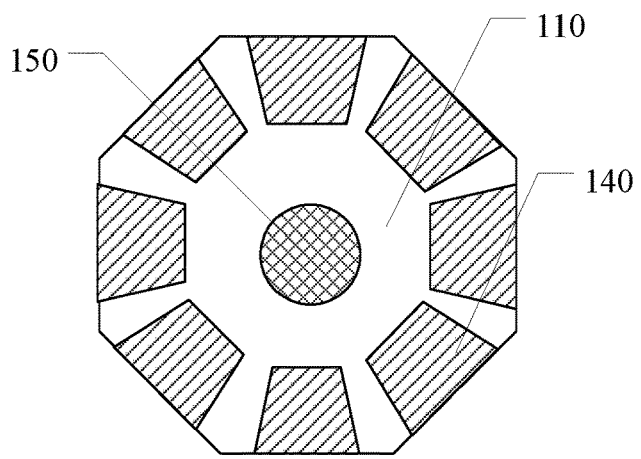
FIG. 11 is further another schematic planar view of the light-emitting diode chip provided by an embodiment of the present disclosure.

FIG. 11 is another schematic planar view of the light-emitting diode chip provided by an embodiment of the present disclosure; as illustrated by FIG. 11, the planar shape of the first conductive type semiconductor layer 110 is an octagon, the at least two first electrodes 140 include eight first electrodes 140, orthographic projections of the eight first electrodes 140 on the first conductive type semiconductor layer 110 are respectively on perpendicular bisectors of eight edges of the octagon, and the orthographic projection of the second electrode 150 on the first conductive type semiconductor layer 110 is at the center of the octagon.

Figure 12:
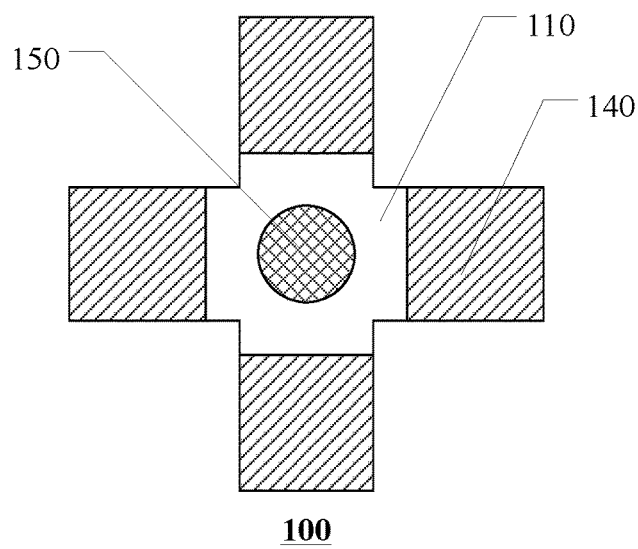
FIG. 12 is further another schematic planar view of the light-emitting diode chip provided by an embodiment of the present disclosure.

FIG. 12 is another schematic planar view of the light-emitting diode chip provided by an embodiment of the present disclosure; as illustrated by FIG. 12, the planar shape of the first conductive type semiconductor layer 110 is a cross shape, the at least two first electrodes 140 include four first electrodes 140, orthographic projections of the four first electrodes 140 on the first conductive type semiconductor layer 110 are respectively at four ends of the cross shape, and the orthographic projection of the second electrode 150 on the first conductive type semiconductor layer 110 is at the center of the cross shape.

It is worth noting that the planar shape of the first conductive type semiconductor layer in the light-emitting diode chip provided by the embodiment of the present disclosure includes but is not limited to the shapes illustrated in the above-mentioned FIGS. 5-12, and the planar shape of the first conductive type semiconductor layer may be other suitable shapes. It should be noted that the above-mentioned "planar shape" refers to the shape of the orthographic projection of the first conductive type semiconductor layer on the base.

Figure 13A:
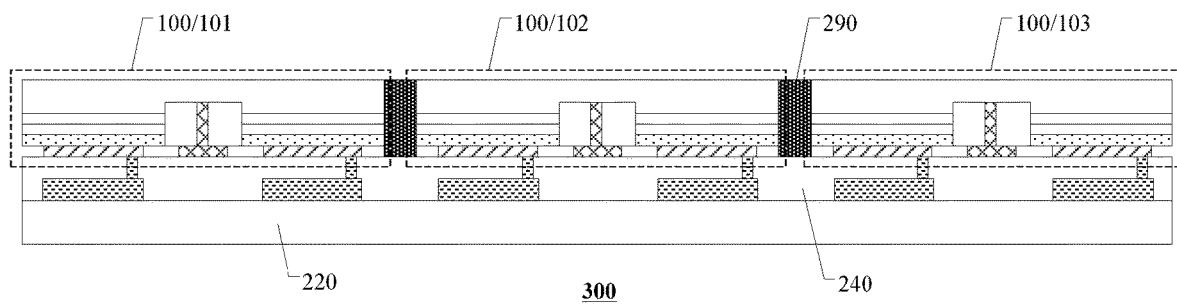
FIG. 13A is a schematic cross-sectional view of the display substrate provided by an embodiment of the present disclosure.

At least one embodiment of the present disclosure further provides a display substrate. FIG. 13A is a schematic cross-sectional view of a display substrate provided by an embodiment of the present disclosure. As illustrated by FIG. 13A, the display substrate 300 includes a substrate 220 and a plurality of first light-emitting diode chips 100 on the substrate 220. The plurality of first light-emitting diode chips 100 described above may adopt the light-emitting diode chips 100 described above. On the one hand, under a condition that the first light-emitting diode chip has a larger size (e.g., 3*5 mil), the size of a single light-emitting structure can be reduced (e.g., to below 20 microns) by forming a plurality of light-emitting structures in the first light-emitting diode chip; that is, the light-emitting diode chip with a smaller size can be manufactured with the existing process precision. Therefore, the light-emitting diode chip can reduce the manufacturing difficulty of the small-sized LED light-emitting structure, thereby improving the product yield and reducing the cost; in addition, the first LED chip can also achieve higher pixels per inch. Moreover, due to the large size of the first light-emitting diode chips, a high yield can be obtained when transferring a plurality of first light-emitting diode chips onto the substrate. On the other hand, because the size of a single light-emitting structure is small, the efficiency of the single light-emitting structure is also high under drive of a small current, so that the power consumption of the display substrate is reduced and the light-emitting efficiency is improved.

In some examples, as illustrated by FIG. 13A, the display substrate 300 further includes a pixel circuit layer 240 located between the substrate 220 and the plurality of first light-emitting diode chips 100. The pixel circuit layer 240 includes a plurality of pixel circuit units 245, and each pixel circuit unit 245 includes a signal output terminal 2450. In each first light-emitting diode chip 100, the at least two first electrodes 140 are respectively connected with the signal output terminals 2455 of different pixel circuit units 245. Therefore, different light-emitting structures in the first light-emitting diode chip can be driven by different pixel circuit units, and can be used as sub pixels of the display substrate.

Figure 13B:
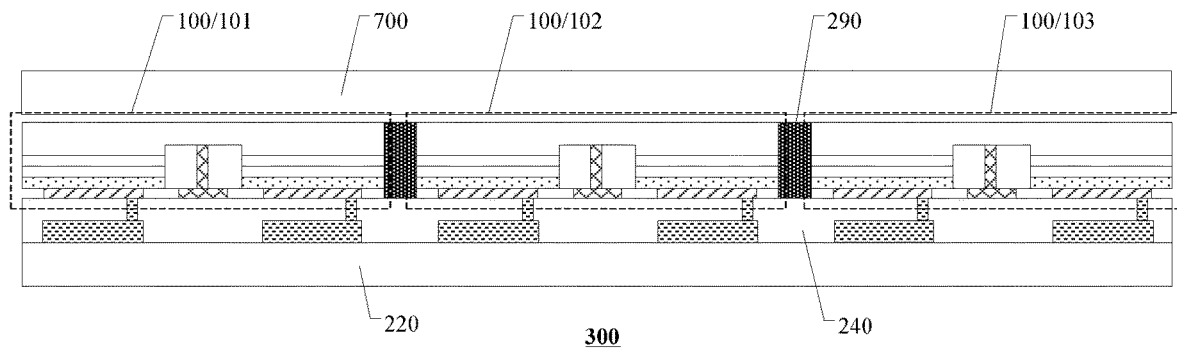
FIG. 13B is another schematic cross-sectional view of the display substrate provided by an embodiment of the present disclosure.

In some examples, as illustrated by FIG. 13A, the display substrate 300 further includes a black matrix 290 located between adjacent first light-emitting diode chips 100. FIG. 13B is another schematic cross-sectional view of the display substrate provided by an embodiment of the present disclosure. As illustrated by FIG. 13B, the display substrate 300 further includes a microstructure substrate 700 disposed on the light exit side of the display substrate. The microstructure substrate 700 may include a plurality of micro-lenses, so that the light-emitting direction of each first light-emitting diode chip or each light-emitting structure can be controlled, thereby realizing more functions, such as three-dimensional (3D) display and light field display.

Figure 14:
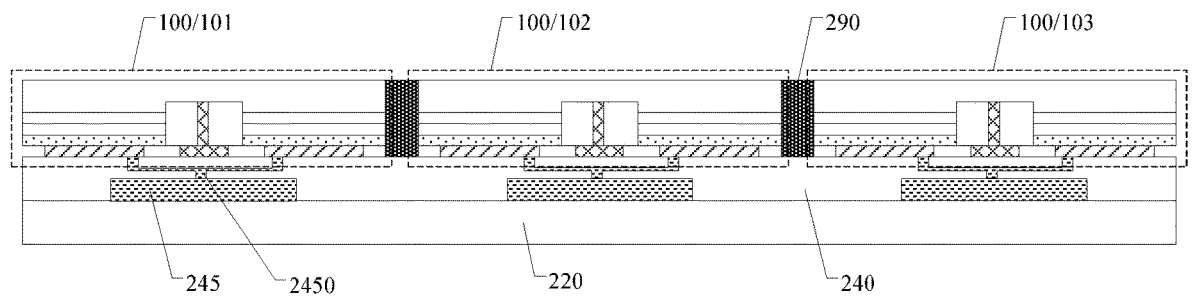
FIG. 14 is further another schematic cross-sectional view of the display substrate provided by an embodiment of the present disclosure.

FIG. 14 is another schematic cross-sectional view of the display substrate provided by an embodiment of the present disclosure. As illustrated by FIG. 14, the display substrate 300 further includes a pixel circuit layer 240 located between the substrate 220 and the plurality of first light-emitting diode chips 100. The pixel circuit layer 240 includes a plurality of pixel circuit units 245, and each pixel circuit unit 245 includes a signal output terminal 2450. The difference of the display substrate illustrated in FIG. 14 from the display substrate illustrated in the FIG. 13A lies in that in each first light-emitting diode chip 100, the at least two first electrodes 140 are respectively connected to the signal output terminal 2450 of a same pixel circuit unit 245. Therefore, the first light-emitting diode chip as a whole can be used as a light-emitting element driven independently, and can be used as not only a light source in a backlight module, but also a sub pixel of a display substrate.

In some examples, as illustrated by FIG. 13 and FIG. 14, the plurality of first light-emitting diode chips 100 include a first color light-emitting diode chips 101 configured to emit light of a first color, a second color light-emitting diode chips 102 configured to emit light of a second color, and a third color light-emitting diode chips 103 configured to emit light of a third color. Therefore, the display substrate can realize color display. For example, the first color is red, the second color is green, and the third color is blue.

Figure 15:
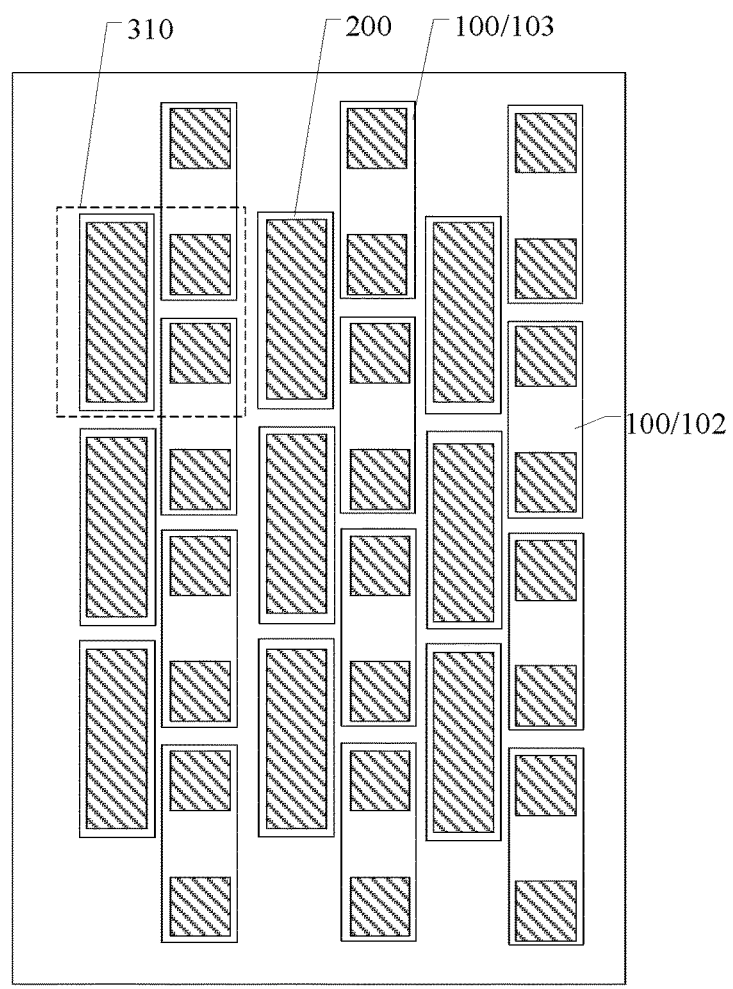
FIG. 15 is a schematic planar view of the display substrate provided by an embodiment of the present disclosure.

FIG. 15 is a schematic planar view of the light-emitting diode chip provided by an embodiment of the present disclosure. As illustrated by FIG. 15, the display substrate 300 may further include a second light-emitting diode chip 200 on the substrate 220, the second light-emitting diode chip 200 is configured to emit light of the first color, the plurality of first light-emitting diode chips 100 include the second color light-emitting diode chip 102 and the third color light-emitting diode chip 103, the second color light-emitting diode chip 102 is configured to emit light of the second color, the third color light-emitting diode chip 103 is configured to emit light of the third color, and the yield of the second light-emitting diode chip 200 is smaller than that of the second color light-emitting diode chip 102 and the third color light-emitting diode chip 103 that are in the same size as the second light-emitting diode chip 200. Therefore, in the display substrate, the second light-emitting diode emitting light of the first color may adopt a larger size, so that the yield of the second light-emitting diode chip emitting red light can be improved, and the yield of the whole display substrate can be improved.

It should be noted that compared with light-emitting diode chips emitting blue light or light-emitting diode chips emitting green light, the manufacturing yield of a small-sized red light-emitting diode chips is lower, and in this case, the first color is red, the second color is green, and the third color is blue. Of course, the embodiments of the present disclosure include but are not limited thereto. With the progress of technology, the second light-emitting diode chip with a lower yield in the same size may also be a light-emitting diode chip emitting light of other colors.

It is worth noting that the display substrate provided by the embodiment of the present disclosure can be used not only as a substrate directly used for color display, but also as a backlight plate in a backlight module. In the case where the display substrate is a backlight plate, the first light-emitting diode chips are configured to emit light of a same color, such as blue light or white light.

In some examples, the substrate 220 is a glass substrate, which can reduce the manufacturing cost of the display substrate. Of course, the embodiments of the present disclosure include but are not limited thereto, and the substrate 220 may be made of other suitable materials.

In some examples, the planar shape of the first conductive type semiconductor layer of the first light-emitting diode chip is an N-polygon, and the orthographic projections of the at least two first electrodes on the first conductive type semiconductor layer are respectively on perpendicular bisectors of at least two edges of the N-polygon or the corners of the N-polygon, and the at least two edges are uniformly distributed among all edges of the N-polygon, and the orthographic projection of the second electrode on the first conductive type semiconductor layer is at a center of the N-polygon; N is a positive integer greater than or equal to 3. In this case, the plurality of first light-emitting diode chips are arranged in an array along a first direction and a second direction on the substrate to constitute an array of the first light-emitting diode chips. Therefore, the display substrate can be directly used for color display, or indirectly used as a backlight for color display, or can be a high-power lighting apparatus.

In some examples, centers of the first conductive type semiconductor layers of all the first light-emitting diode chips arranged in the first direction are approximately on a same straight line. In this case, all the first light-emitting diode chips arranged in the first direction can be arranged according to the same orientation as above mentioned, that is, all the first light-emitting diode chips arranged in the first direction are repeatedly arranged in the first direction.

It should be noted that in the case where the first light-emitting diode chips include first light-emitting diode chips of different colors, the first light-emitting diode chips of different colors may be alternately arranged.

In some examples, extension directions of two adjacent edges respectively of two first conductive type semiconductor layers of two adjacent first light-emitting diode chips arranged in the first direction are substantially parallel, and a distance between the two adjacent ones of the plurality of light-emitting diode chips arranged in the first direction is less than 75 microns. That is, two first light-emitting diode chips adjacent in the first direction are closely arranged, so that the pixels per inch of the display substrate can be improved.

In some examples, the centers of the first conductive type semiconductor layers of the first light-emitting diode chips arranged in the first direction are on different straight lines, the extension directions of two adjacent edges respectively of two first conductive type semiconductor layers of two adjacent ones of the plurality of first light-emitting diode chips arranged in the first direction are approximately parallel, and a distance between the two adjacent ones of the plurality of light-emitting diode chips arranged in the first direction is less than 75 microns. For example, in the case where the above-mentioned N-polygon is a hexagon or a hexagon, the compact arrangement can be realized by locating the centers of the first conductive type semiconductor layers of the first light-emitting diode chips arranged in the first direction on different straight lines and allowing the extension directions of two adjacent edges respectively of the first conductive type semiconductor layers of two adjacent light-emitting diode chips in the first direction are approximately parallel.

Figure 16:
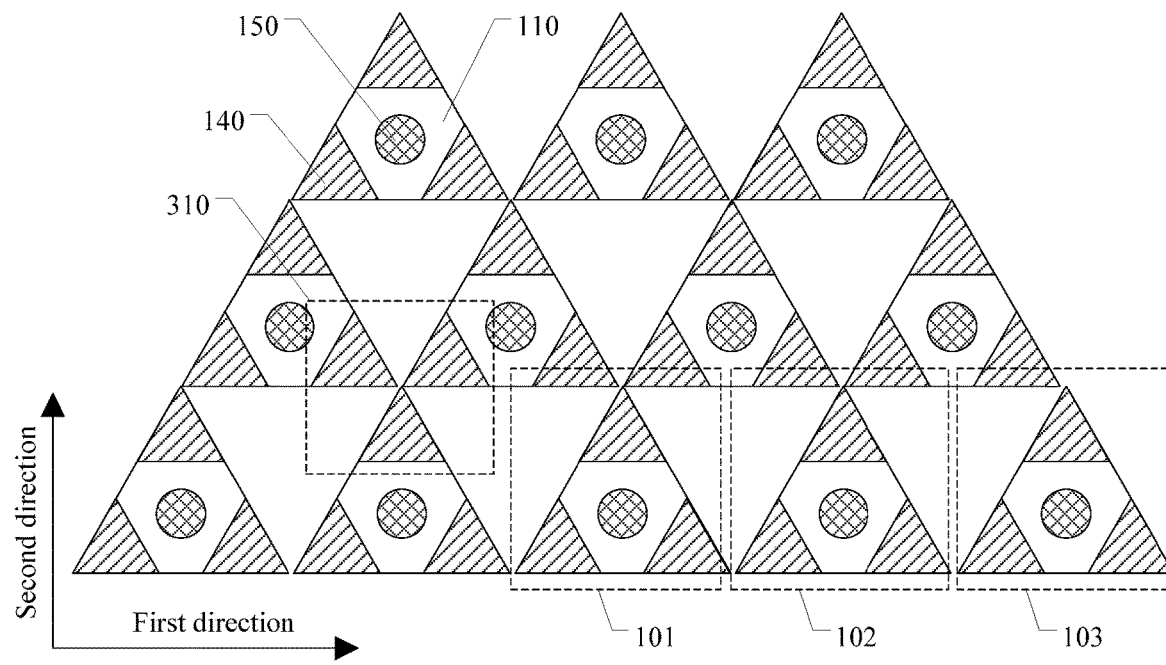
FIG. 16 is another schematic planar view of the display substrate provided by an embodiment of the present disclosure.

FIG. 16 is another schematic planar view of the display substrate provided by an embodiment of the present disclosure. As illustrated by FIG. 16, the planar shape of the first conductive type semiconductor layer 110 is a triangle, the at least two first electrodes 140 include three first electrodes 140, orthographic projections of the three first electrodes 140 on the first conductive type semiconductor layer 110 are respectively at three corners of the triangle, the orthographic projection of the second electrodes 150 on the first conductive type semiconductor layer 110 is at the center of the triangle, and the plurality of light-emitting diode chips 100 are arranged in an array along the first direction and the second direction on the substrate 220.

In some examples, as illustrated by FIG. 16, bottom edges of the first conductive type semiconductor layers 110 of all the first light-emitting diode chips 100 arranged in the first direction are on a same straight line. That is, each light-emitting diode chip in a row of first light-emitting diode chips arranged in the first direction has the same orientation.

For example, as illustrated by FIG. 16, the first light-emitting diode chips 100 arranged in the first direction constitute a light-emitting diode chip row. In order to make the first light-emitting diode chips in the display substrate more evenly distributed, two adjacent light-emitting diode chip rows in the second direction may be arranged in a staggered way, for example, a staggered distance may be ½ of the maximum size of the first light-emitting diode chips in the first direction.

For example, as illustrated by FIG. 16, the corners of two adjacent first light-emitting diode chips in the first direction and the corner of one first light-emitting diode chip in the next row are closely arranged, and the three light-emitting structures located at the corners of the three first light-emitting diode chips constitute one pixel 310, and the pixel 310 may include sub pixels of different colors which are the above-mentioned light-emitting structures. In this case, the plurality of first light-emitting diode chips 100 adjacent in the first direction may include the first color light-emitting diode chip 101, the second color light-emitting diode chip 102 and the third color light-emitting diode chip 103. Furthermore, the first color light-emitting diode chip 101, the second color light-emitting diode chip 102 and the third color light-emitting diode chip 103 are arranged alternately with each other.

Figure 17:
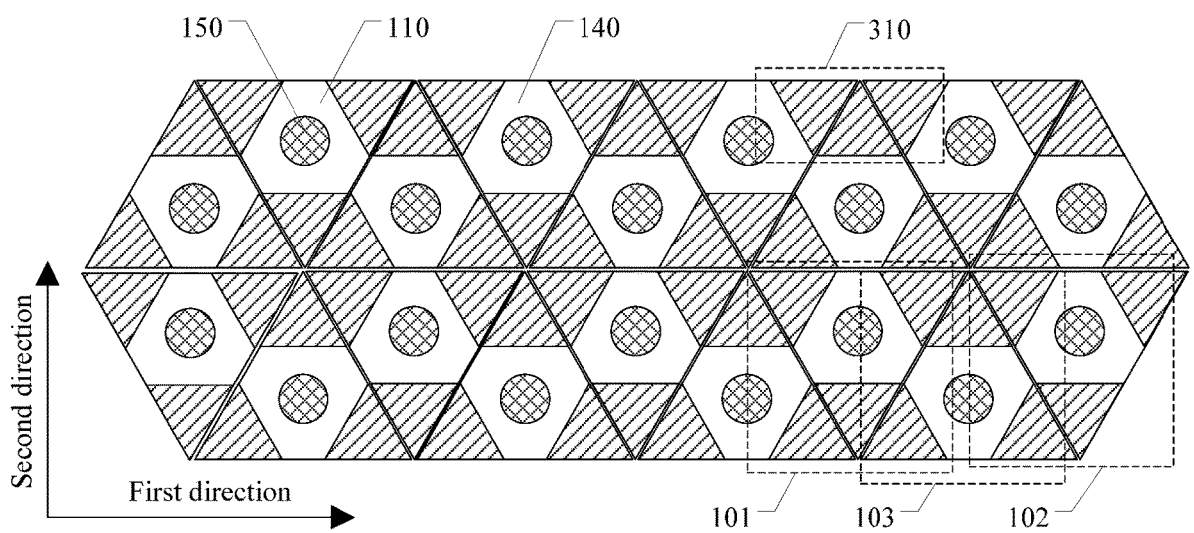
FIG. 17 is further another schematic planar view of the display substrate provided by an embodiment of the present disclosure.

FIG. 17 is another schematic planar view of the display substrate provided by an embodiment of the present disclosure. As illustrated by FIG. 17, the planar shape of the first conductive type semiconductor layer 110 is still a triangle. In this case, extension directions of two adjacent edges respectively of the first conductive type semiconductor layers of two adjacent first light-emitting diode chips arranged in the first direction are substantially parallel, and a distance between the two adjacent light-emitting diode chips arranged in the first direction is less than 75 microns. Therefore, the arrangement of a plurality of first light-emitting diode chips in the display substrate is more compact, so that the pixels per inch (PPI) can be further improved.

For example, as illustrated by FIG. 17, the corners of three adjacent first light-emitting diode chips in the first direction are closely arranged, and the three light-emitting structures located at the corners of the three first light-emitting diode chips constitute one pixel 310, and the pixel 310 include sub pixels of different colors which are the above light-emitting structures. In this case, the plurality of first light-emitting diode chips 100 adjacent in the first direction may include the first color light-emitting diode chip 101, the second color light-emitting diode chip 102 and the third color light-emitting diode chip 103. Furthermore, the first color light-emitting diode chip 101, the second color light-emitting diode chip 102 and the third color light-emitting diode chip 103 are arranged alternately with each other.

For example, as illustrated by FIG. 17, in the display substrate, two pixels 310 that are closer in distance in the second direction, one of the two pixels 310 can be used as a left-eye pixel in 3D display, and the other can be used as a right-eye pixel in 3D display, so that 3D display can be realized and disadvantages caused by uneven pixel distribution can be avoided.

Figure 18:
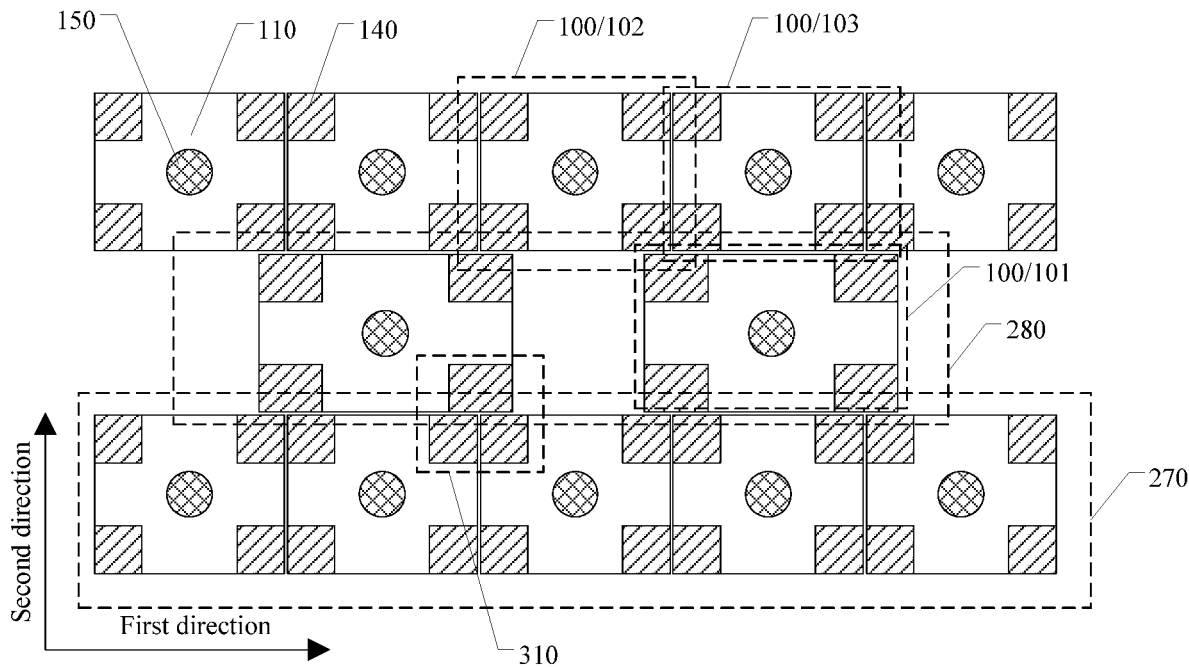
FIG. 18 is further another schematic planar view of the display substrate provided by an embodiment of the present disclosure.

FIG. 18 is another schematic planar view of the display substrate provided by an embodiment of the present disclosure. As illustrated by FIG. 18, the planar shape of the first conductive type semiconductor layer 110 is a rectangle, the at least two first electrodes 140 include four first electrodes 140, the orthographic projections of the four first electrodes 140 on the first conductive type semiconductor layer 110 are respectively at four corners of the rectangle, and the orthographic projection of the second electrode 150 on the first conductive type semiconductor layer 110 is at the center of the rectangle, and the plurality of first light-emitting diode chips 100 are arranged in an array along the first direction and the second direction on the substrate 220.

In some examples, as illustrated by FIG. 18, the plurality of first light-emitting diode chips 100 include the first color light-emitting diode chips 101, the second color light-emitting diode chips 102 and the third color light-emitting diode chips 103 which are arranged alternately with each other in the first direction to constitute a first light-emitting row 270, the first color light-emitting diode chips 101 are arranged in the first direction to constitute a second light-emitting row 280; the first light-emitting row 270 and the second light-emitting row 280 are arranged in a staggered way in the second direction, which refers to that the first light-emitting row 270 are not aligned with the second light-emitting row 280 in the second direction; the size of the first color light-emitting diode chip 101 in the first direction is larger than that of the second color light-emitting diode chip 102 in the first direction; in each first color light-emitting diode chip 101, each first electrode 140 overlaps in the second direction with the first electrode of the second color light-emitting diode chip 102 adjacent to this first electrode 140 and with the first electrode 140 of the third color light-emitting diode chip 103 adjacent to this first electrode 140, which facilitates the composition of pixels 310 including sub pixels of different colors. Of course, the embodiments of the present disclosure include but are not limited thereto, and the above-mentioned first light-emitting diode chips may all emit light of a same color, and in this case, the display substrate can be used as the backlight of a display apparatus.

Figure 19:
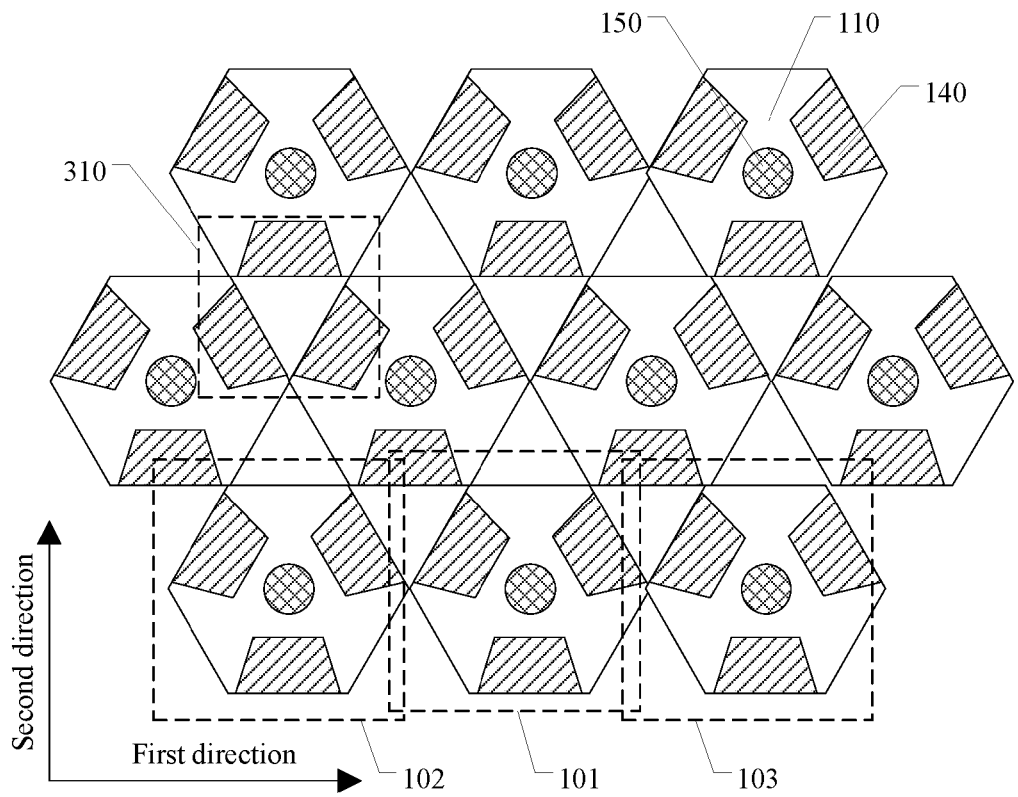
FIG. 19 is further another schematic planar view of the display substrate provided by an embodiment of the present disclosure.

FIG. 19 is further another schematic planar view of the display substrate provided by an embodiment of the present disclosure. As illustrated by FIG. 19, the planar shape of the first conductive type semiconductor layer 110 is a hexagon, the at least two first electrodes 140 include three first electrodes 140, orthographic projections of the three first electrodes 140 on the first conductive type semiconductor layer 110 are respectively on perpendicular bisectors of three edges spaced apart from each other in the hexagon, the orthographic projection of the second electrode 150 on the first conductive type semiconductor layer 110 is at the center of the hexagon, and the plurality of light-emitting diode chips 100 are arranged in an array along the first direction and the second direction on the substrate 220.

In some examples, as illustrated by FIG. 19, centers of the first conductive type semiconductor layers 110 of all the first light-emitting diode chips 100 arranged in the first direction are approximately on a same straight line.

For example, as illustrated by FIG. 19, two adjacent first light-emitting diode chips arranged in the first direction are adjacent to one first light-emitting diode chip in the previous row, and the three light-emitting structures respectively at three edges of the three first light-emitting diode chips constitute one pixel 310, and the pixel 310 may include sub pixels of different colors which are the above-mentioned light-emitting structures. In this case, the plurality of first light-emitting diode chips 100 adjacent in the first direction may include the first color light-emitting diode chip 101, the second color light-emitting diode chip 102 and the third color light-emitting diode chip 103. Furthermore, the first color light-emitting diode chip 101, the second color light-emitting diode chip 102 and the third color light-emitting diode chip 103 are arranged alternately with each other. Of course, the embodiments of the present disclosure include but are not limited thereto, and the first light-emitting diode chips may all emit light of a same color, and in this case, the display substrate can be used as the backlight of a display apparatus.

Figure 20:
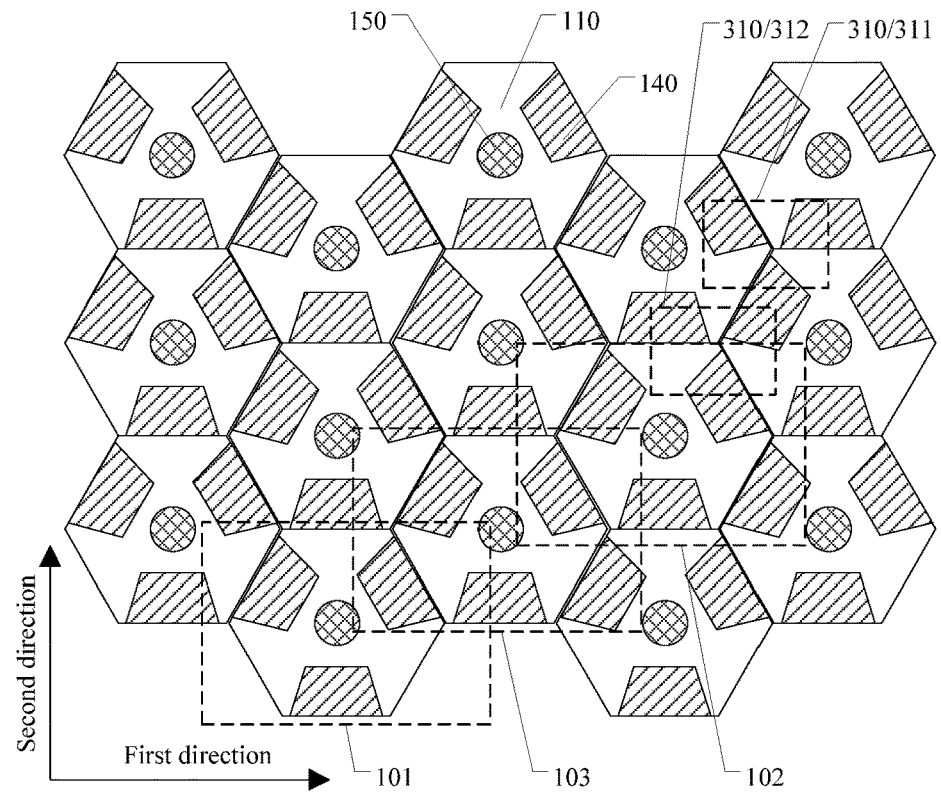
FIG. 20 is further another schematic planar view of the display substrate provided by an embodiment of the present disclosure.

FIG. 20 is further another schematic planar view of the display substrate provided by an embodiment of the present disclosure. As illustrated by FIG. 20, the centers of the first conductive type semiconductor layers 110 of the first light-emitting diode chips 100 arranged in the first direction are on different straight lines, the extension directions of two adjacent edges respectively of the first conductive type semiconductor layers 110 of two adjacent first light-emitting diode chips 100 arranged in the first direction are approximately parallel, and a distance between the two adjacent light-emitting diode chips 100 arranged in the first direction is less than 75 microns. Therefore, the arrangement of the plurality of first light-emitting diode chips in the display substrate is more compact, so that the pixels per inch (PPI) can be further improved.

For example, as illustrated by FIG. 20, two adjacent first light-emitting diode chips in the first direction and one first light-emitting diode chip in the next row are closely arranged, and the three light-emitting structures respectively at three edges of the three first light-emitting diode chips constitute one pixel 310, and the pixel 310 may include sub pixels of different colors which are the above-mentioned light-emitting structures. In this case, the plurality of first light-emitting diode chips 100 adjacent in the first direction may include the first color light-emitting diode chip 101, the second color light-emitting diode chip 102 and the third color light-emitting diode chip 103. Of course, the embodiments of the present disclosure include but are not limited thereto, and the first light-emitting diode chips may all emit light of a same color, and in this case, the display substrate can be used as the backlight of a display apparatus.

For example, as illustrated by FIG. 20, in the display substrate, the arrangement of the above-mentioned pixels 310 can adopt a sub pixel rendering (SPR) technology, and two adjacent pixels 311 and 312 render at least one sub pixel which is the above-mentioned light-emitting structure to each other, thereby further improving the pixels per inch. Of course, embodiments of the present disclosure include but are not limited thereto, and two adjacent pixels may not adopt the sub pixel rendering (SPR) technology.

Figure 21:
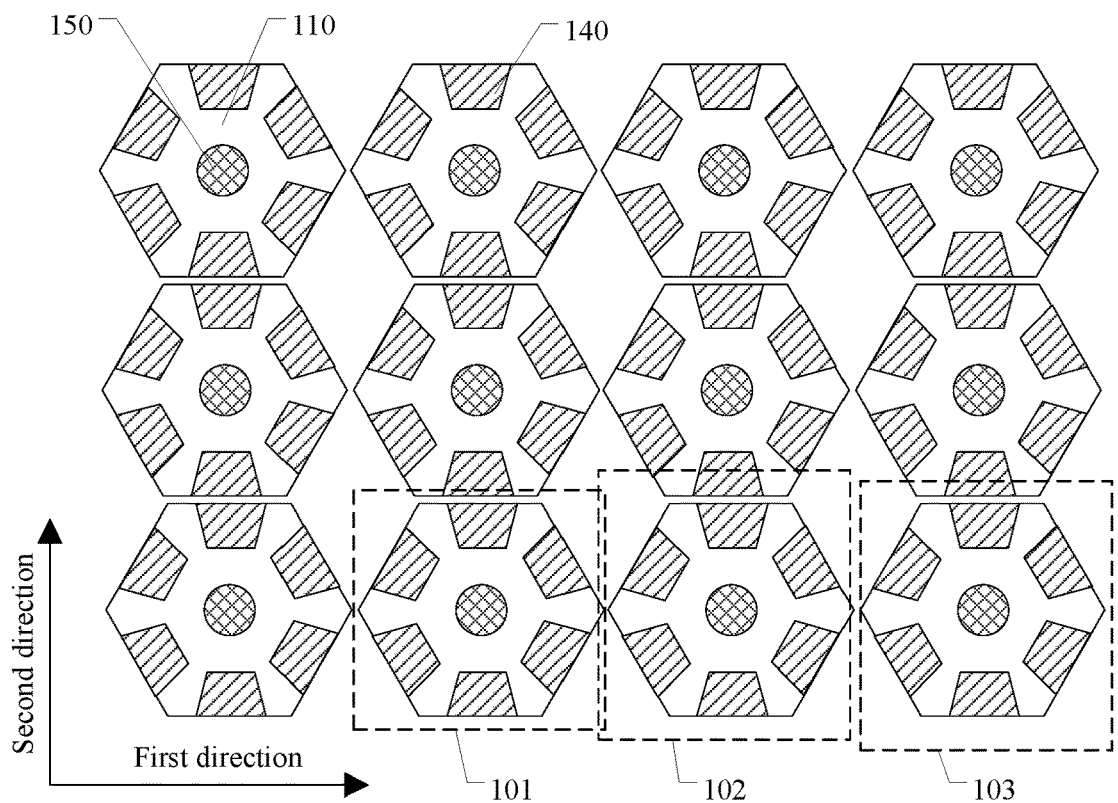
FIG. 21 is further another schematic planar view of the display substrate provided by an embodiment of the present disclosure.

FIG. 21 is further another schematic planar view of the display substrate provided by an embodiment of the present disclosure. As illustrated by FIG. 21, the planar shape of the first conductive semiconductor layer 110 is a hexagon, the at least two first electrodes 140 include six first electrodes 140, orthographic projections of the six first electrodes 140 on the first conductive semiconductor layer 110 are respectively on perpendicular bisectors of six edges of the hexagon, and the orthographic projection of the second electrode 150 on the first conductive semiconductor layer 110 is at the center of the hexagon. The plurality of light-emitting diode chips 100 are arranged in an array along the first direction and the second direction on the substrate 220, and centers of the first conductive type semiconductor layers 110 of the first light-emitting diode chips 100 arranged in the first direction are approximately on a same straight line. In this case, the above-mentioned first light-emitting diode chips may also include first light-emitting diode chips emitting different colors, such as the first color light-emitting diode chips emitting the first color light, the second color light-emitting diode chips emitting the second color light and third color light-emitting diode chips emitting the third color light, so as to realize color display. Of course, the embodiments of the present disclosure include but are not limited thereto, and the above-mentioned first light-emitting diode chips may all emit light of a same color, and in this case, the display substrate can be used as the backlight of a display apparatus.

Figure 22:
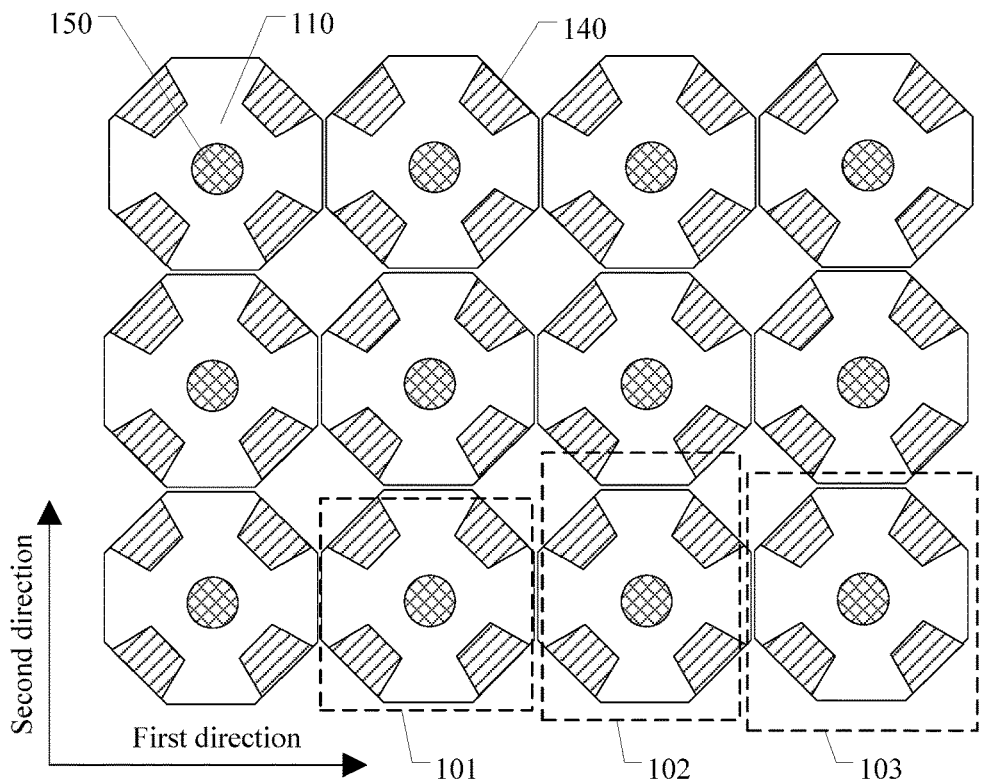
FIG. 22 is further another schematic planar view of the display substrate provided by an embodiment of the present disclosure.

FIG. 22 is further another schematic planar view of the display substrate provided by an embodiment of the present disclosure. As illustrated by FIG. 22, the planar shape of the first conductive type semiconductor layer 110 is an octagon, and the at least two first electrodes 140 include four first electrodes 140, orthographic projections of the four first electrodes 140 on the first conductive type semiconductor layer 110 are respectively on perpendicular bisectors of four edges spaced apart from each other in the octagon, the orthographic projection of the second electrode 150 on the first conductive type semiconductor layer 110 is at the center of the hexagon, the plurality of light-emitting diode chips 100 are arranged in an array along the first direction and the second direction on the substrate 220, and centers of the first conductive type semiconductor layers 110 of the first light-emitting diode chips 100 arranged in the first direction are approximately on a same straight line. In this case, the above-mentioned first light-emitting diode chips may also include first light-emitting diode chips emitting different colors, such as the first color light-emitting diode chips emitting the first color light, the second color light-emitting diode chips emitting the second color light and third color light-emitting diode chips emitting the third color light, so as to realize color display. Of course, the embodiments of the present disclosure include but are not limited thereto, and the above-mentioned first light-emitting diode chips may all emit light of a same color, and in this case, the display substrate can be used as the backlight of a display apparatus.

Figure 23:
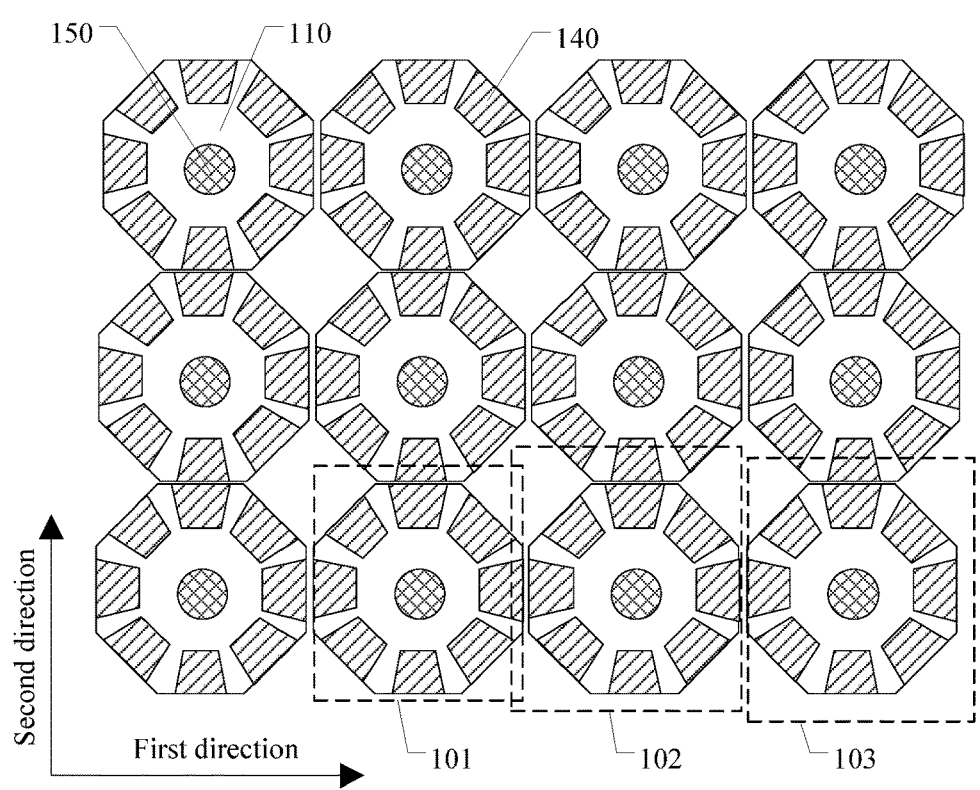
FIG. 23 is further another schematic planar view of the display substrate provided by an embodiment of the present disclosure.

FIG. 23 is further another schematic planar view of the display substrate provided by an embodiment of the present disclosure. As illustrated by FIG. 23, the planar shape of the first conductive type semiconductor layer 110 is an octagon, the at least two first electrodes 140 include eight first electrodes 140, orthographic projections of the eight first electrodes 140 on the first conductive type semiconductor layer 110 are respectively on perpendicular bisectors of eight edges of the octagon, and the orthographic projection of the second electrode 150 on the first conductive type semiconductor layer 110 is at the center of the octagon, the plurality of light-emitting diode chips 100 are arranged in an array along the first direction and the second direction on the substrate 220, and centers of the first conductive type semiconductor layers 110 of the first light-emitting diode chips 100 arranged in the first direction are approximately on a same straight line. In this case, the above-mentioned first light-emitting diode chips may also include first light-emitting diode chips emitting different colors, such as the first color light-emitting diode chips emitting the first color light, the second color light-emitting diode chips emitting the second color light and third color light-emitting diode chips emitting the third color light, so as to realize color display. Of course, the embodiments of the present disclosure include but are not limited thereto, and the above-mentioned first light-emitting diode chips may all emit light of a same color, and in this case, the display substrate can be used as the backlight of a display apparatus.

Figure 24:
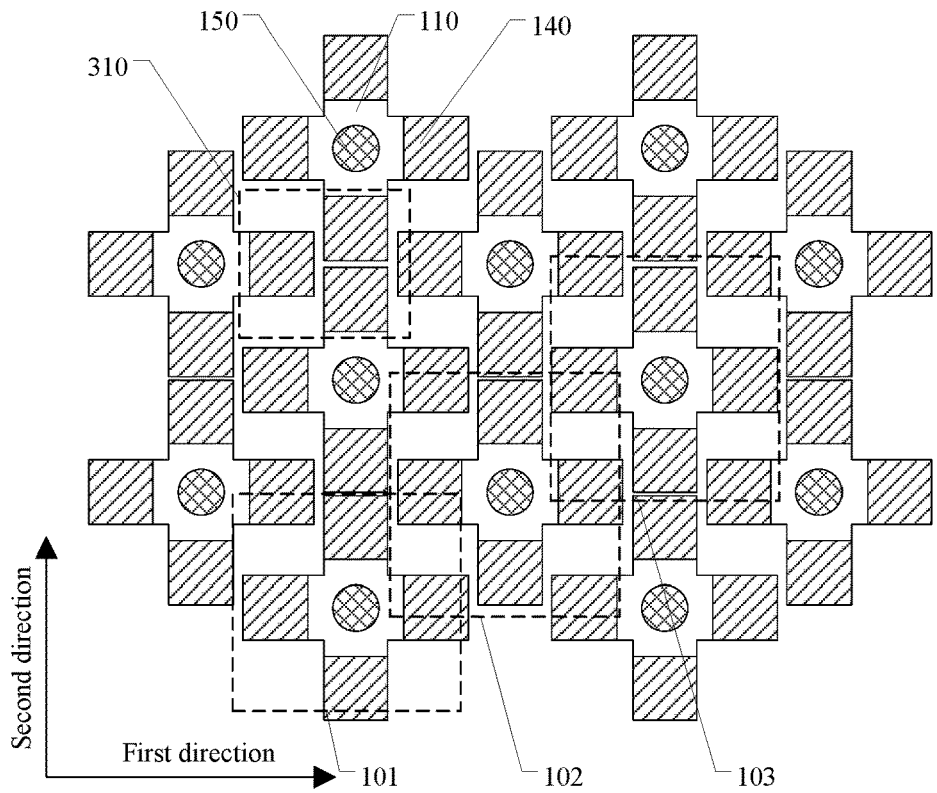
FIG. 24 is further another schematic planar view of the display substrate provided by an embodiment of the present disclosure.

FIG. 24 is further another schematic planar view of the display substrate provided by an embodiment of the present disclosure. As illustrated by FIG. 24, the planar shape of the first conductive type semiconductor layer 110 is a cross shape, the at least two first electrodes 140 include four first electrodes 140, orthographic projections of the four first electrodes 140 on the first conductive type semiconductor layer 110 are respectively at four ends of the cross shape, and the orthographic projection of the second electrode 150 on the first conductive type semiconductor layer 110 is at the center of the cross shape; the plurality of light-emitting diode chips 100 are arranged in an array along the first direction and the second direction on the substrate 220, and centers of the first conductive type semiconductor layers 110 of the first light-emitting diode chips 100 arranged in the first direction are on different straight lines.

For example, as illustrated by FIG. 24, two ends respectively of two adjacent first light-emitting diode chips in the first direction and one first light-emitting diode chip in the next row are closely arranged, and the three light-emitting structures respectively at three ends of the three first light-emitting diode chips constitute one pixel 310, and the pixel 310 may include sub pixels of different colors which are the above-mentioned light-emitting structures. In this case, the plurality of first light-emitting diode chips 100 adjacent in the first direction may include the first color light-emitting diode chip 101, the second color light-emitting diode chip 102 and the third color light-emitting diode chip 103. Of course, the embodiments of the present disclosure include but are not limited thereto, and the first light-emitting diode chips may all emit light of a same color, and in this case, the display substrate can be used as the backlight of a display apparatus. At least one embodiment of the present disclosure further provides a manufacturing method of a display substrate.

For example, as illustrated by FIG. 24, in the display substrate, the arrangement of the above-mentioned pixels 310 can adopt the sub pixel rendering (SPR) technology, and two adjacent pixels 310 render at least one sub pixel which is the above-mentioned light-emitting structure to each other, thereby further improving the pixels per inch. Of course, embodiments of the present disclosure include but are not limited thereto, and two adjacent pixels may not adopt the sub pixel rendering (SPR) technology.

Figure 25:
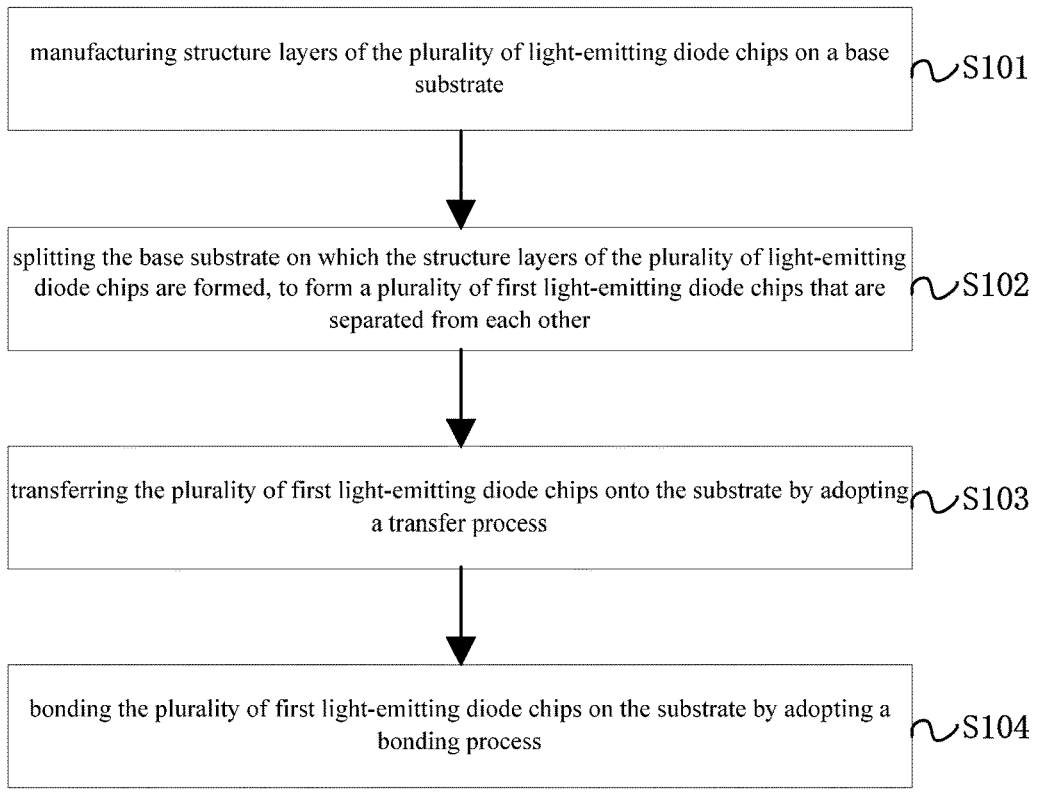
FIG. 25 is a schematic flow chart of a manufacturing method of a display substrate provided by an embodiment of the present disclosure.

FIG. 25 is a schematic flow chart of a manufacturing method of a display substrate provided by an embodiment of the present disclosure.

The manufacturing method of the display substrate comprises steps S101-S104.

Step S101: manufacturing structure layers of the plurality of light-emitting diode chips on a base substrate. It should be noted that the above-mentioned structural layers may include epitaxial layers in the light-emitting diode chip, and the epitaxial layers include the first conductive type semiconductor layer, the light-emitting layer, the second conductive type semiconductor layer, etc., and may further include the first electrode and the second electrode of the light-emitting diode chip. Each of the epitaxial layers mentioned above is a whole film which is set on the base substrate and is not divided.

For example, the above-mentioned base substrate may be a crystalline base, such as a sapphire base. Of course, the embodiments of the present disclosure include but are not limited thereto, and the above-mentioned substrate may be other base substrates suitable for growing the epitaxial layers such as the first conductive type semiconductor layer and so on.

Step S102: splitting the base substrate on which the structure layers of the plurality of light-emitting diode chips are formed, to form a plurality of first light-emitting diode chips that are separated from each other.

Step S103: transferring the plurality of first light-emitting diode chips onto the substrate by adopting a transfer process.

For example, the above-mentioned substrate may be a substrate with a pixel drive circuit or a backlight drive circuit. In addition, the above-mentioned substrate may be a glass substrate, so that the manufacturing cost can be reduced.

Step S104: bonding the plurality of first light-emitting diode chips on the substrate by adopting a bonding process.

In the manufacturing method of the display substrate, the plurality of first light-emitting diode chips are split first, and then the plurality of first light-emitting diode chips are transferred to the substrate through a transfer process. Therefore, the manufacturing method of the display substrate is suitable for manufacturing the display substrate directly used for display. In this case, on the one hand, under a condition that the first light-emitting diode chip has a larger size (e.g., 3*5 mil), and the size of a single light-emitting structure can be reduced by forming a plurality of light-emitting structures in the first light-emitting diode chip; that is, a light-emitting diode chip with a smaller size can be manufactured with the existing process precision. Therefore, the light-emitting diode chip can reduce the manufacturing difficulty of the small-sized LED light-emitting structure, thereby improving the product yield and reducing the cost; in addition, the first light-emitting diode chip can also achieve higher pixels per inch. In addition, due to the large size of the first light-emitting diode chips, a high yield can be obtained when transferring the plurality of first light-emitting diode chips onto the substrate. On the other hand, because the size of the single light-emitting structure is small, the efficiency of the single light-emitting structure is also high under drive of a small current, so that the power consumption of the display substrate is reduced and the light-emitting efficiency is improved.

In some examples, the step of splitting the structure layers of the plurality of light-emitting diode chips to form the plurality of first light-emitting diode chips that are separated from each other includes: splitting the structure layers of the plurality of light-emitting diode chips to form the plurality of light-emitting diode chips that are separated from each other by an etching process. Compared with the splitting process such as cutting and laser dicing, the etching process is convenient to form the first light-emitting diode chips with various shapes (such as the light-emitting diode chips illustrated in FIGS. 6-12).

In some examples, bonding the plurality of first light-emitting diode chips to the substrate using a bonding process includes: bonding the plurality of first light-emitting diode chips on the substrate by adopting a reflow soldering process.

Figure 26:
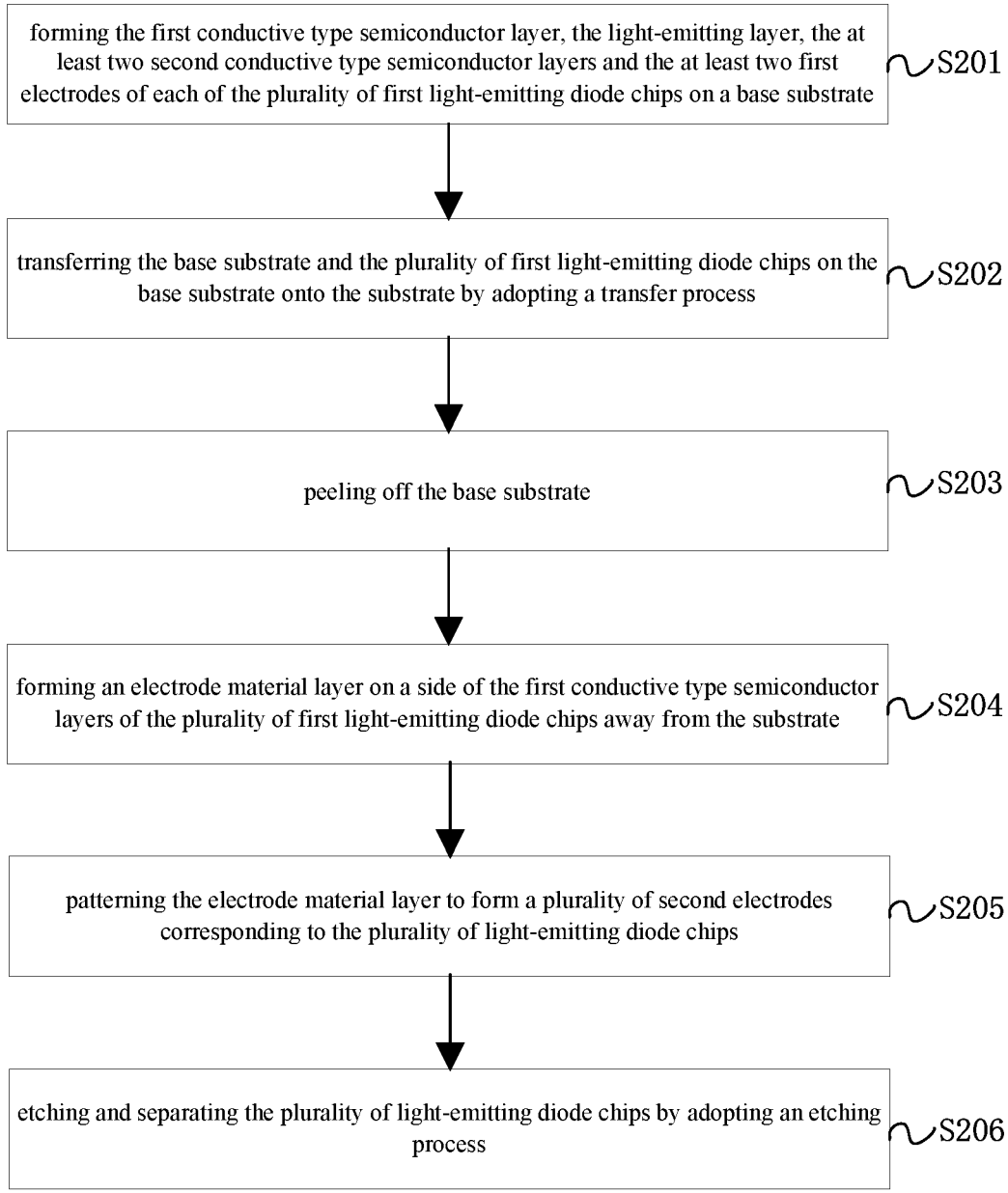
FIG. 26 is another schematic flow chart of the manufacturing method of the display substrate provided by an embodiment of the present disclosure.

At least one embodiment of the present disclosure further provides a manufacturing method of the display substrate. FIG. 26 is a schematic flowchart of a manufacturing method of the display substrate provided by an embodiment of the present disclosure. As illustrated by FIG. 26, the manufacturing method of the display substrate includes the following steps S201-S206.

Step S201: forming the first conductive type semiconductor layer, the light-emitting layer, the at least two second conductive type semiconductor layers and the at least two first electrodes of each of the plurality of first light-emitting diode chips on a base substrate. It should be noted that in this case, the second electrodes of the first light-emitting diode chips have not been formed.

For example, the above-mentioned base substrate may be a crystalline base, such as a sapphire base. Of course, the embodiments of the present disclosure include but are not limited thereto, and the above-mentioned base substrate may be other bases suitable for growing the epitaxial layer such as the first conductive type semiconductor layer.

Step S202: transferring the base substrate and the plurality of first light-emitting diode chips on the base substrate onto the substrate by adopting a transfer process.

Step S203: peeling off the base substrate;

Step S204: forming an electrode material layer on a side of the first conductive type semiconductor layers of the plurality of first light-emitting diode chips away from the substrate.

Step S205: patterning the electrode material layer to form a plurality of second electrodes corresponding to the plurality of light-emitting diode chips.

Step S206: etching and separating the plurality of light-emitting diode chips by adopting an etching process.

In the manufacturing method of the display substrate, the base substrate and the plurality of first light-emitting diode chips on the base substrate as a whole are transferred to the substrate, and then the plurality of second electrodes are formed by the patterning process, and the plurality of first light-emitting diode chips are separated by an etching process, so that the manufacturing method of the display substrate has low transfer difficulty and can greatly improve the product yield.

It should be noted that the first light-emitting diode chip has a vertical structure, which greatly simplifies the structure of the light-emitting diode chip, thus reducing the manufacturing difficulty and cost. On the other hand, due to the simple structure of the first light-emitting diode chip with the vertical structure, the yield of the light-emitting diode chip can also be improved. Especially, for light-emitting diode chips emitting red light, the yield can be increased from 40%-50% to over 80%, and the manufacturing cost can be reduced by over 50%.

Figure 27:
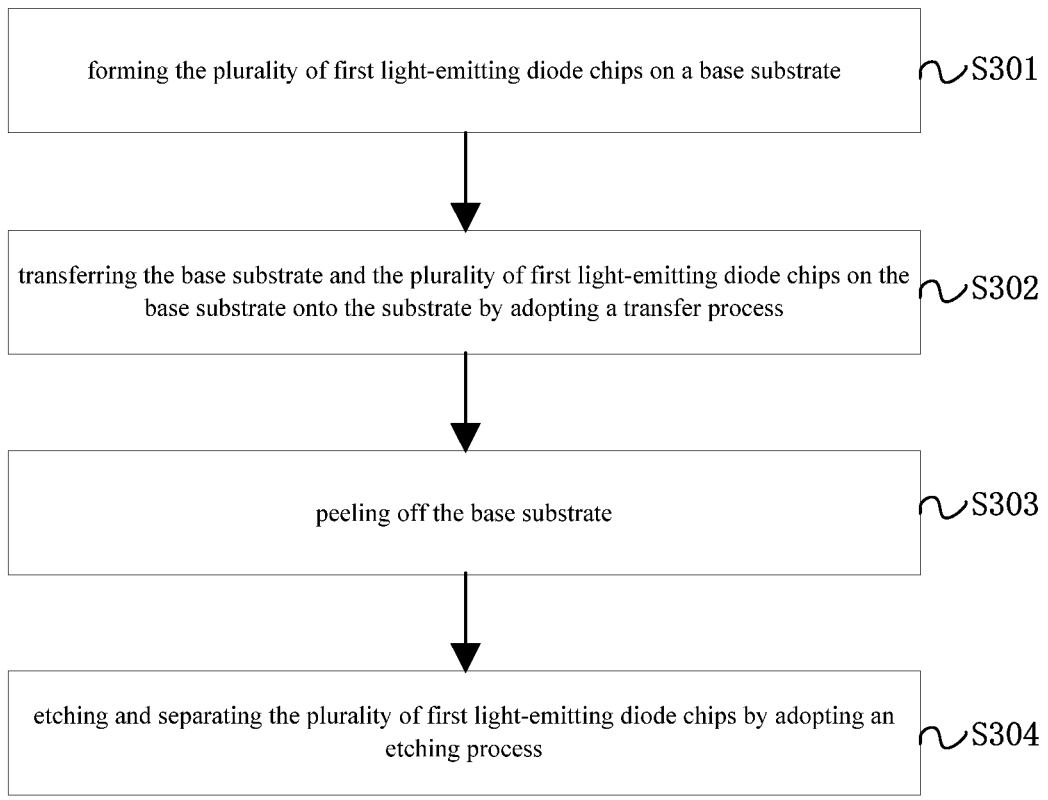
FIG. 27 is another schematic flow chart of the manufacturing method of the display substrate provided by an embodiment of the present disclosure.

At least one embodiment of the present disclosure further provides a manufacturing method of the display substrate. FIG. 27 is another schematic flowchart of the method for manufacturing the display substrate provided by an embodiment of the present disclosure. As illustrated by FIG. 27, the manufacturing method of the display substrate includes steps S301-S304.

Step S301: forming the plurality of first light-emitting diode chips on a base substrate.

For example, the above-mentioned base substrate may be a crystalline base, such as a sapphire base. Of course, the embodiments of the present disclosure include but are not limited thereto, and the above-mentioned base substrate may be other bases suitable for growing the epitaxial layer such as the first conductive type semiconductor layer.

Step S302: transferring the base substrate and the plurality of first light-emitting diode chips on the base substrate onto the substrate by adopting a transfer process.

Step S303: peeling off the base substrate.

Step S304: etching and separating the plurality of first light-emitting diode chips by adopting an etching process.

In the manufacturing method of the display substrate, the base substrate and the plurality of first light-emitting diode chips on the base substrate as a whole are transferred to the substrate, and then the plurality of second electrodes are formed by the patterning process, and the plurality of first light-emitting diode chips are separated by an etching process, so that the manufacturing method of the display substrate has low transfer difficulty and can greatly improve the product yield.

It should be noted that the above-mentioned first light-emitting diode chip adopts a flip-chip structure, which can increase the current density and further increase the luminous efficiency.

The following statements need to be explained:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely particular embodiments of the present disclosure but are not limitative to the scope of the present disclosure; any of those skilled familiar with the related arts can easily conceive variations and substitutions in the technical scopes disclosed by the present disclosure, which should be encompassed in protection scopes of the present disclosure. Therefore, the scopes of the present disclosure should be defined in the appended claims.

What is claimed is:

1. A light-emitting diode chip, comprising:
   a first conductive type semiconductor layer;
   a light-emitting layer at a side of the first conductive type semiconductor layer;
   at least two second conductive type semiconductor layers at a side of the light-emitting layer away from the first conductive type semiconductor layer; and
   at least two first electrodes electrically respectively connected with the at least two second conductive type semiconductor layers,
   wherein orthographic projections of the at least two second conductive type semiconductor layers on the first conductive type semiconductor layer are spaced apart from each other, and orthographic projections of the at least two first electrodes on the first conductive type semiconductor layer are spaced apart from each other, the light-emitting diode chip further comprises a base substrate, wherein the first conductive type semiconductor layer, the light-emitting layer, and the second conductive type semiconductor layer are sequentially stacked on the base substrate, the light-emitting layer and the second conductive type semiconductor layer are partially etched to expose the first conductive type semiconductor layer, the light-emitting diode chip further comprises a first insulation layer located on a side of an exposed portion of the first conductive type semiconductor layer away from the base substrate, the first insulation layer is in direct contact with the exposed portion of the first conductive type semiconductor layer, an orthographic projection of the light-emitting layer on the base substrate is not overlapped with an orthographic projection of the first insulation layer on the base substrate, and an orthographic projection of the first electrode on the base substrate partially overlaps with the orthographic projection of the first insulation layer on the base substrate.

2. The light-emitting diode chip according to claim 1, further comprising:

a second electrode electrically connected to the first conductive type semiconductor layer, wherein the second electrode, the first conductive type semiconductor layer, the light-emitting layer, the at least two second conductive type semiconductor layers and the at least two first electrodes constitute at least two light-emitting structures, and the at least two light-emitting structures share the first conductive type semiconductor layer.

3. The light-emitting diode chip according to claim 2, wherein the second electrode is at a side of the first conductive type semiconductor layer away from the light-emitting layer, and the at least two first electrodes are at a side of the at least two second conductive type semiconductor layers away from the light-emitting layer.

4. The light-emitting diode chip according to claim 2, wherein both the second electrode and the at least two first electrodes are at a side of the at least two second conductive type semiconductor layers away from the light-emitting layer.

5. The light-emitting diode chip according to claim 4, wherein the orthographic projections of the at least two first electrodes on the first conductive type semiconductor layer surrounds an orthographic projection of the second electrode on the first conductive type semiconductor layer.

6. The light-emitting diode chip according to claim 1, wherein a planar shape of the first conductive type semiconductor layer is an N-polygon, and the orthographic projections of the at least two first electrodes on the first conductive type semiconductor layer are respectively on perpendicular bisectors of at least two edges of the N-polygon or on corners of the N-polygon, and the at least two edges are uniformly distributed among all edges of the N-polygon, an orthographic projection of a second electrode on the first conductive type semiconductor layer is at a center of the N-polygon, and N is a positive integer greater than or equal to 3.

7. The light-emitting diode chip according to claim 1, wherein a planar shape of the first conductive type semiconductor layer is any one selected from a group consisting of a triangle, a rectangle, a cross shape, a pentagon, a hexagon, and an octagon.

8. The light-emitting diode chip according to claim 1, wherein a size of the first conductive type semiconductor layer ranges from 3 mil to 5 mil, and a size of the orthographic projection of each of the first electrodes on the first conductive type semiconductor layer is less than 20 microns.

9. A display substrate, comprising:

a substrate; and a plurality of first light-emitting diode chips on the substrate, wherein each of the plurality of first light-emitting diode chips is the light-emitting diode chip according to claim 1.

10. The display substrate according to claim 9, further comprising:

a pixel circuit layer between the substrate and the plurality of first light-emitting diode chips, wherein the pixel circuit layer comprises a plurality of pixel circuit units, each of the plurality of pixel circuit units comprises a signal output end, in each of the plurality of first light-emitting diode chips, the at least two first electrodes are respectively connected with the signal output ends of different ones of the plurality of pixel circuit units.

11. The display substrate according to claim 9, further comprising:

a pixel circuit layer between the substrate and the plurality of first light-emitting diode chips, wherein the pixel circuit layer comprises a plurality of pixel circuit units, each of the plurality of pixel circuit units comprises a signal output end, in each of the plurality of first light-emitting diode chips, the at least two first electrodes are respectively connected with the signal output end of a same one of the plurality of pixel circuit units.

12. The display substrate according to claim 9, further comprising:

a plurality of second light-emitting diode chips on the substrate, wherein each of the plurality of second light-emitting diode chips is configured to emit light of a first color, and the plurality of first light-emitting diode chips comprise a second color light-emitting diode chip and a third color light-emitting diode chip, the second color light-emitting diode chip is configured to emit light of a second color, and the third color light-emitting diode chip is configured to emit light of a third color, a yield of the second light-emitting diode chip is smaller than a yield of the second color light-emitting diode chip with a same size as the second light-emitting diode chip and smaller than a yield of the third color light-emitting diode chip with the same size as the second light-emitting diode chip.

13. The display substrate according to claim 9, wherein a planar shape of the first conductive type semiconductor layer is an N-polygon, the orthographic projections of the at least two first electrodes on the first conductive type semiconductor layer are on perpendicular bisectors of at least two edges of the N-polygon or on corners of the N-polygon, the at least two edges are uniformly distributed among all edges of the N-polygon, and an orthographic projection of a second electrode on the first conductive type semiconductor layer is at a center of the N-polygon, and N is a positive integer greater than or equal to 3, and the plurality of first light-emitting diode chips are arranged in an array along a first direction and a second direction on the substrate.

14. The display substrate according to claim 13, wherein centers of the first conductive type semiconductor layers of all first light-emitting diode chips arranged in the first direction are approximately on a same straight line.

15. The display substrate according to claim 13, wherein extension directions of two adjacent edges respectively of two first conductive type semiconductor layers of two adjacent ones of the plurality of first light-emitting diode chips arranged in the first direction are substantially parallel, and a distance between the two adjacent ones of the plurality of first light-emitting diode chips arranged in the first direction is less than 75 microns.

16. The display substrate according to claim 13, wherein centers of the first conductive type semiconductor layers of the first light-emitting diode chips arranged in the first direction are on different straight lines,
   extension directions of two adjacent edges respectively of two first conductive type semiconductor layers of two adjacent ones of the plurality of first light-emitting diode chips arranged in the first direction are approximately parallel, and a distance between the two adjacent ones of the plurality of first light-emitting diode chips arranged in the first direction is less than 75 microns.

17. The display substrate according to claim 9, further comprising:
   a black matrix between adjacent ones of the plurality of the first light-emitting diode chips, wherein the substrate is a glass substrate.

18. The display substrate according to claim 9, wherein the plurality of first light-emitting diode chips are configured to emit light of a same color.

19. A manufacturing method of the display substrate according to claim 9, comprising:
   manufacturing structure layers of the plurality of first light-emitting diode chips on a base substrate;
   splitting the base substrate on which the structure layers of the plurality of first light-emitting diode chips are formed, to form a plurality of first light-emitting diode chips that are separated from each other;
   transferring the plurality of first light-emitting diode chips onto the substrate by adopting a transfer process; and
   bonding the plurality of first light-emitting diode chips on the substrate by adopting a bonding process.

20. The manufacturing method of the display substrate according to claim 19, wherein the splitting the base substrate on which the structure layers of the plurality of first light-emitting diode chips are formed, to form the plurality of first light-emitting diode chips that are separated from each other comprises:
   adopting an etching process to split the structure layers of the plurality of first light-emitting diode chips to form the plurality of first light-emitting diode chips that are separated from each other, and
   the bonding the plurality of first light-emitting diode chips on the substrate by adopting the bonding process comprises:
   bonding the plurality of first light-emitting diode chips on the substrate by adopting a reflow soldering process.

* * * * *